(12) United States Patent
Kim et al.

(10) Patent No.: US 12,720,730 B2
(45) Date of Patent: Aug. 25, 2026

(54) INTEGRATED CIRCUIT DEVICE

(71) Applicant: Samsung Electronics Co., Ltd., Suwon-si (KR)

(72) Inventors: Yangdoo Kim, Suwon-si (KR); Dongwook Kim, Suwon-si (KR); Sangwuk Park, Suwon-si (KR); Minkyu Suh, Suwon-si (KR); Geonyeop Lee, Suwon-si (KR); Dokeun Lee, Suwon-si (KR); Jungpyo Hong, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 562 days.

(21) Appl. No.: 18/312,795

(22) Filed: May 5, 2023

(65) Prior Publication Data

US 2024/0074149 A1 Feb. 29, 2024

(30) Foreign Application Priority Data

Aug. 24, 2022 (KR) ........................ 10-2022-0106349

(51) Int. Cl.
*H10B 12/00* (2023.01)

(52) U.S. Cl.
CPC ....... *H10B 12/315* (2023.02); *H10B 12/0335* (2023.02)

(58) Field of Classification Search
CPC ............. H10B 12/315; H10B 12/0335; H10B 12/033; H10D 1/716
See application file for complete search history.

(56) References Cited

U.S. PATENT DOCUMENTS

| | | | |
|---|---|---|---|
| 8,268,695 | B2 | 9/2012 | Kiehlbauch et al. |
| 8,470,668 | B2 | 6/2013 | Cho et al. |
| 8,617,950 | B2 | 12/2013 | Kuh et al. |
| 8,647,958 | B2 | 2/2014 | Lee |
| 8,652,926 | B1 | 2/2014 | Lugani et al. |
| 8,734,656 | B2 | 5/2014 | Kiehlbauch |
| 8,815,697 | B2 | 8/2014 | Yoon et al. |
| 8,969,167 | B2 | 3/2015 | Yoon et al. |
| 10,475,661 | B2 | 11/2019 | Seo et al. |
| 10,825,889 | B2 | 11/2020 | Kang et al. |
| 10,854,614 | B2 | 12/2020 | Kim et al. |
| 2012/0098132 | A1 | 4/2012 | Park et al. |

FOREIGN PATENT DOCUMENTS

| | | | |
|---|---|---|---|
| CN | 113517399 | A | 10/2021 |
| KR | 100487915 | B1 | 8/2005 |
| KR | 100587078 | B1 | 6/2006 |
| KR | 2009/0036320 | A | 4/2009 |
| KR | 102086774 | B1 | 3/2020 |
| KR | 2021-0136068 | A | 11/2021 |
| KR | 2022-0059846 | A | 5/2022 |

*Primary Examiner* — Samuel A Gebremariam
(74) *Attorney, Agent, or Firm* — Harness, Dickey & Pierce, P.L.C.

(57) ABSTRACT

An integrated circuit (IC) device may include a conductive area on a substrate; a first electrode connected to the conductive area on the substrate, a width of the first electrode in a lateral direction gradually increasing toward the substrate; a second electrode on the substrate, the second electrode including a silicon germanium (SiGe) film, the SiGe film surrounding the first electrode; and a dielectric film between the first electrode and the second electrode. A content of a component of the SiGe film may vary according to a distance from the substrate.

20 Claims, 37 Drawing Sheets

FIG. 4C 400
486
484
482
480
470
462
460
432
450
420
422
412
410
Z
Y
X
X1 - X1'
Z
X
Y
Y1 - Y1'
436
440P1
440P2
440
430
450
434

INTEGRATED CIRCUIT DEVICE

CROSS-REFERENCE TO RELATED APPLICATION

This application is based on and claims priority under 35 U.S.C. § 119 to Korean Patent Application No. 10-2022-0106349, filed on Aug. 24, 2022, in the Korean Intellectual Property Office, the disclosure of which is incorporated by reference herein in its entirety.

BACKGROUND

Inventive concepts relate to an integrated circuit (IC) device, and more particularly, to an IC device including a capacitor.

Due to the development of electronics technology, the downscaling of semiconductor devices has rapidly progressed. Thus, patterns included in an electronic device are being miniaturized. Accordingly, it may be necessary to develop IC devices having structures capable of maintaining desired electrical properties by ensuring required capacitances even when the size of a capacitor is miniaturized.

SUMMARY

Inventive concepts provide an integrated circuit (IC) device having a structure capable of maintaining an increased capacitance and excellent electrical properties by increasing an effective area of a lower electrode even when a size of a capacitor is reduced with the miniaturization of the IC device.

According to an embodiment of inventive concepts, an IC device may include a conductive area on a substrate; a first electrode connected to the conductive area on the substrate, a width of the first electrode in a lateral direction gradually increasing toward the substrate; a second electrode on the substrate, the second electrode including a silicon germanium (SiGe) film, the SiGe film surrounding the first electrode; and a dielectric film between the first electrode and the second electrode. A content of a component of the SiGe film may vary according to a distance from the substrate.

According to an embodiment of inventive concepts, an IC device may include a substrate having a memory cell area and an interfacial area adjacent to the memory cell area, the substrate including a plurality of active areas in the memory cell area; a plurality of conductive areas at a first vertical level on the substrate in the memory cell area, each conductive area among the plurality of conductive areas being connected to one active area from the plurality of active areas; and a plurality of capacitors at a second vertical level on the substrate in the memory cell area. The plurality of capacitors may be respectively connected to the plurality of conductive areas. The second vertical level may be higher than the first vertical level. The plurality of capacitors may include a plurality of first electrodes, a second electrode having a plurality of holes inside which the plurality of first electrodes are contained, and a plurality of dielectric films apart from each other and respectively one-by-one inside the plurality of holes. Each of the plurality of first electrodes may have a bottom surface in contact with a corresponding conductive area among the plurality of conductive areas. Each of the plurality of first electrodes may have a width that gradually increases toward the substrate in a lateral direction. The second electrode may include a silicon germanium (SiGe) film. A content of a component of the SiGe film may vary according to a distance from the substrate. Each of the plurality of dielectric films may surround a corresponding one of the plurality of first electrodes.

According to an embodiment of inventive concepts, an IC device may include a substrate having an active area; a bit line on the substrate; an insulating structure covering a top surface of the bit line and a sidewall of the bit line; a contact structure on the substrate, a first electrode, a second electrode, and a dielectric film. The contact structure may include a contact plug in contact with the active area of the substrate, a metal silicide film covering a top surface of the contact plug, and a conductive landing pad covering a top surface of the metal silicide film. The contact plug may be adjacent to the bit line in a lateral direction and apart from the bit line with the insulating structure therebetween. The metal silicide film may be apart from the bit line with the insulating structure therebetween. The conductive landing pad may be apart from the bit line with the insulating structure therebetween. The first electrode may be on the conductive landing pad. The first electrode may have a bottom surface in contact with a top surface of the conductive landing pad. A width of the first electrode in the lateral direction may gradually increase toward the substrate. The second electrode may be on the substrate and may have a hole that contains the first electrode. The second electrode may include a doped silicon germanium (SiGe) film. A content of at least one component of the doped SiGe film may vary according to a distance from the substrate. A dielectric film may be inside a hole of the doped SiGe film. The dielectric film may be between the first electrode and the second electrode. In the doped SiGe film, the at least one component may include at least one of a germanium (Ge) atom, a fluorine (F) atom, and a hydrogen (H) atom.

BRIEF DESCRIPTION OF THE DRAWINGS

Embodiments of inventive concepts will be more clearly understood from the following detailed description taken in conjunction with the accompanying drawings in which:

FIG. 4C is a detailed cross-sectional view of a lower structure of FIG. 4A, which illustrates some components in a portion corresponding to cross-sections taken along lines A-A' and B-B' of FIG. 3;

DETAILED DESCRIPTION

Figure 1:
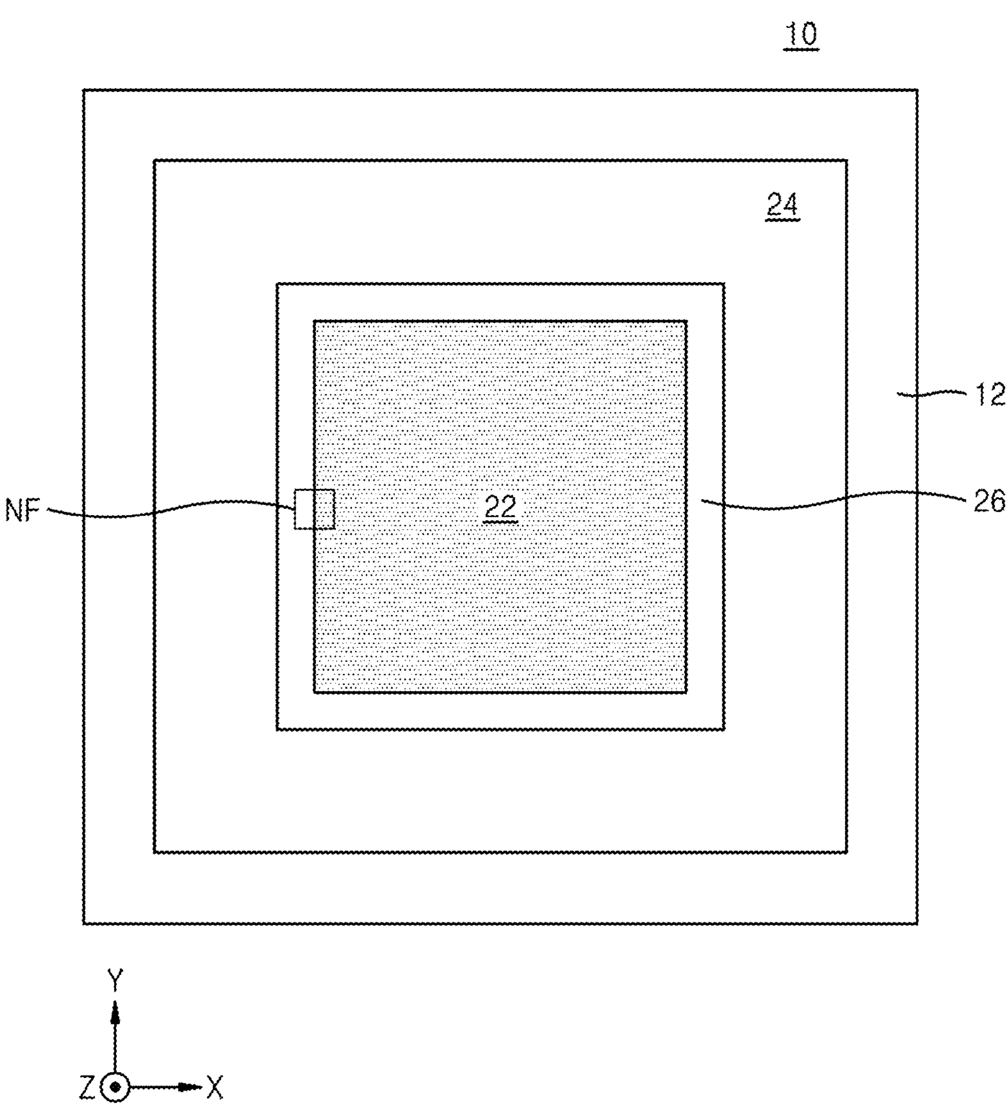
FIG. 1 is a plan view of a configuration of an integrated circuit (IC) device according to embodiments.

Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

Hereinafter, embodiments will be described in detail with reference to the accompanying drawings. The same reference numerals are used to denote the same elements in the drawings, and repeated descriptions thereof are omitted.

FIG. 1 is a plan view of a configuration of an integrated circuit (IC) device according to embodiments.

Referring to FIG. 1, an IC device 10 may include a substrate 12, which has a memory cell area 22, a peripheral circuit area 24 surrounding the memory cell area 22, and an interfacial area 26 between the memory cell area 22 and the peripheral circuit area 24. The interfacial area 26 may be adjacent to the memory cell area 22.

The substrate 12 may include, for example, a semiconductor element (e.g., silicon (Si) and germanium (Ge)) and at least one compound semiconductor selected from silicon germanium (SiGe), silicon carbide (SiC), gallium arsenide (GaAs), indium arsenide (InAs), and indium phosphide (InP). The substrate 12 may include a conductive area, for example, a doped well or a doped structure.

In embodiments, the memory cell area 22 may include a memory cell area of dynamic random access memory (DRAM). The memory cell area 22 may include a plurality of unit memory cells, each of which includes a transistor and a capacitor. The peripheral circuit area 24 may be an area in which peripheral circuits configured to drive memory cells in the memory cell area 22 are arranged. A plurality of conductive lines and insulating structures may be arranged in the interfacial area 26. The plurality of conductive lines may be installed to enable electrical connection of the memory cell area 22 to the peripheral circuit area 24. The insulating structures may insulate the memory cell area 22 from the peripheral circuit area 24.

Figure 2:
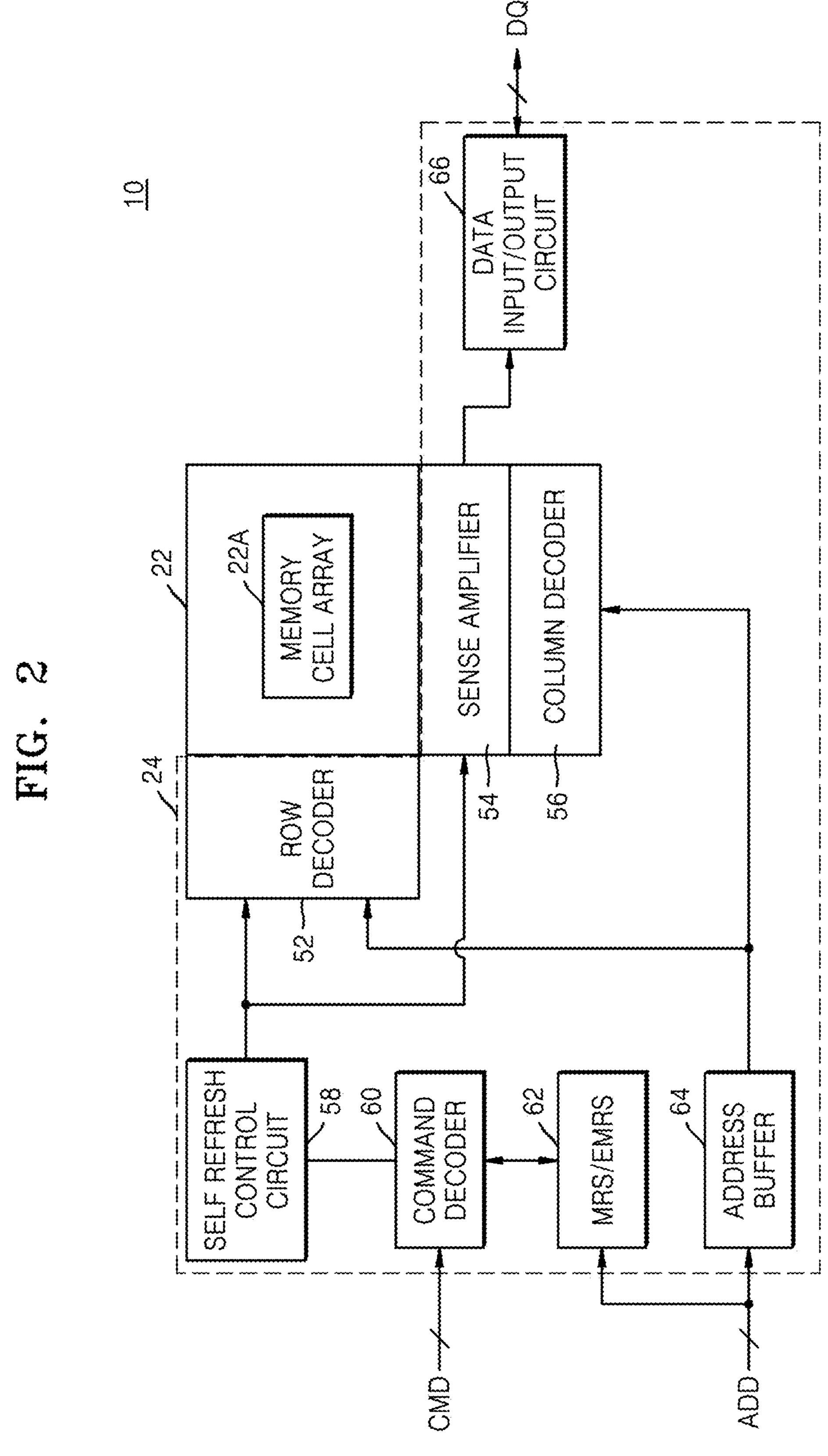
FIG. 2 is a block diagram of an example configuration of an IC device including a dynamic random access memory (DRAM) device.

FIG. 2 is a block diagram of an example configuration of an IC device 10 including a DRAM device.

Referring to FIG. 2, a memory cell area 22 may include a memory cell array 22A. In the memory cell array 22A, a plurality of memory cells configured to store data may be arranged in a row direction and a column direction. Each of the plurality of memory cells may include a cell capacitor and an access transistor. A gate of the access transistor may be connected to a corresponding one of a plurality of word lines arranged in the row direction, one of a source and a drain of the access transistor may be connected to a bit line or a complementary bit line arranged in the column direction, and the other thereof may be connected to the cell capacitor.

The peripheral circuit area 24 may include a row decoder 52, a sense amplifier 54, a column decoder 56, a self-refresh control circuit 58, a command decoder 60, a mode register set/extended mode register set (MRS/EMRS) circuit 62, an address buffer 64, and a data input/output (I/O) circuit 66.

The sense amplifier 54 may sense and amplify data of the memory cell and store data in the memory cell. The sense amplifier 54 may be implemented as a cross-coupled amplifier connected between the bit line and the complementary bit line, which are included in the memory cell array 22A.

Data DQ input through the data I/O circuit 66 may be written to the memory cell array 22A based on an address signal ADD, while data DQ read from the memory cell array 22A based on the address signal ADD may be output to the outside through the data I/O circuit 66. To designate a memory cell to and from which data is to be written or read, the address signal ADD may be input to the address buffer 64. The address buffer 64 may temporarily store the address signal ADD, which is input from the outside.

To designate a word line connected to the memory cell to and from which data is input or output, the row decoder 52 may decode a row address of the address signal ADD output from the address buffer 64. That is, in a data write or read mode, the row decoder 52 may decode the row address output by the address buffer 64 and enable a word line corresponding to the decoded row address. In addition, in a self-refresh mode, the row decoder 52 may decode the row address generated by an address counter and enable the corresponding word line.

To designate a bit line connected to the memory cell to and from which data is input or output, the column decoder 56 may decode a column address of the address signal ADD output by the address buffer 64. The memory cell array 22A may output data from the memory cell designated by the row and column addresses or write data to the memory cell.

The command decoder 60 may receive a command signal CMD, which is applied from the outside, decode the command signal CMD, and internally generate a decoded command signal (e.g., a self-refresh entry command or a self-refresh exit command).

The MRS/EMRS circuit 62 may set an internal mode register in response to an MRS/EMRS command and an address signal ADD for designating an operation mode of the IC device 10.

Although not shown in FIG. 2, the IC device 10 may further include a clock circuit configured to generate a clock signal and a power circuit configured to receive a power supply voltage applied from the outside and generate or divide an internal voltage.

The self-refresh control circuit 58 may control a self-refresh operation of the IC device 10 in response to a command output by the command decoder 60. The command decoder 60 may include the address counter, a timer, and a core voltage generator. The address counter may generate a row address to be self-refreshed, in response to the self-refresh entry command output by the command decoder 60 and apply the row address to the row decoder 52. The address counter may interrupt a counting operation in response to the self-refresh exit command output by the command decoder 60.

Figure 3:
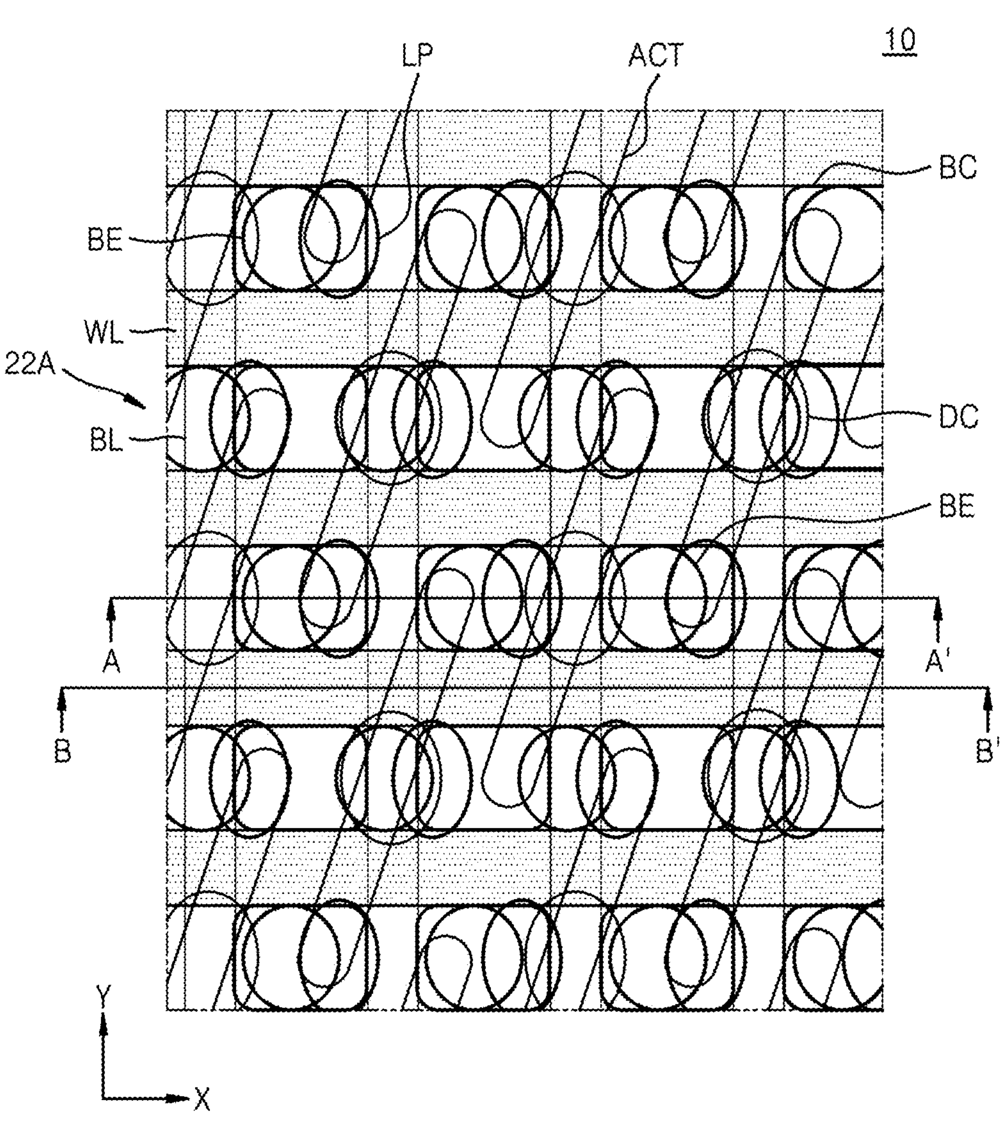
FIG. 3 is a plan layout diagram of some components of a memory cell array of an IC device according to embodiments.

FIG. 3 is a plan layout diagram of some components of the memory cell array 22A shown in FIG. 2.

Referring to FIG. 3, the IC device 10 may include a plurality of active areas ACT. The plurality of active areas ACT may be arranged in a diagonal direction with respect to a first lateral direction (X direction) and a second lateral direction (Y direction).

A plurality of word lines WL may intersect with the plurality of active areas ACT and extend parallel to each other in the first lateral direction (X direction). On the plurality of word lines WL, a plurality of bit lines BL may extend parallel to each other in the second lateral direction (Y direction), which intersects with the first lateral direction (X direction). The plurality of bit lines BL may be respectively connected to the plurality of active areas ACT through direct contacts DC.

A plurality of buried contacts BC may be formed between two adjacent ones of the plurality of bit lines BL. In embodiments, the plurality of buried contacts BC may be arranged in a line in the first lateral direction (X direction) and the second lateral direction (Y direction). A plurality of conductive landing pads LP may be respectively on the plurality of buried contacts BC. A plurality of lower electrodes BE may be respectively on the plurality of conductive landing pads LP.

The plurality of buried contacts BC and the plurality of conductive landing pads LP may connect the plurality of lower electrodes BE to the active area ACT. At least a portion of each of the plurality of conductive landing pads LP may vertically overlap the buried contact BC. At least a portion of each of the plurality of lower electrodes BE may vertically overlap the conductive landing pad LP.

Figure 4A:
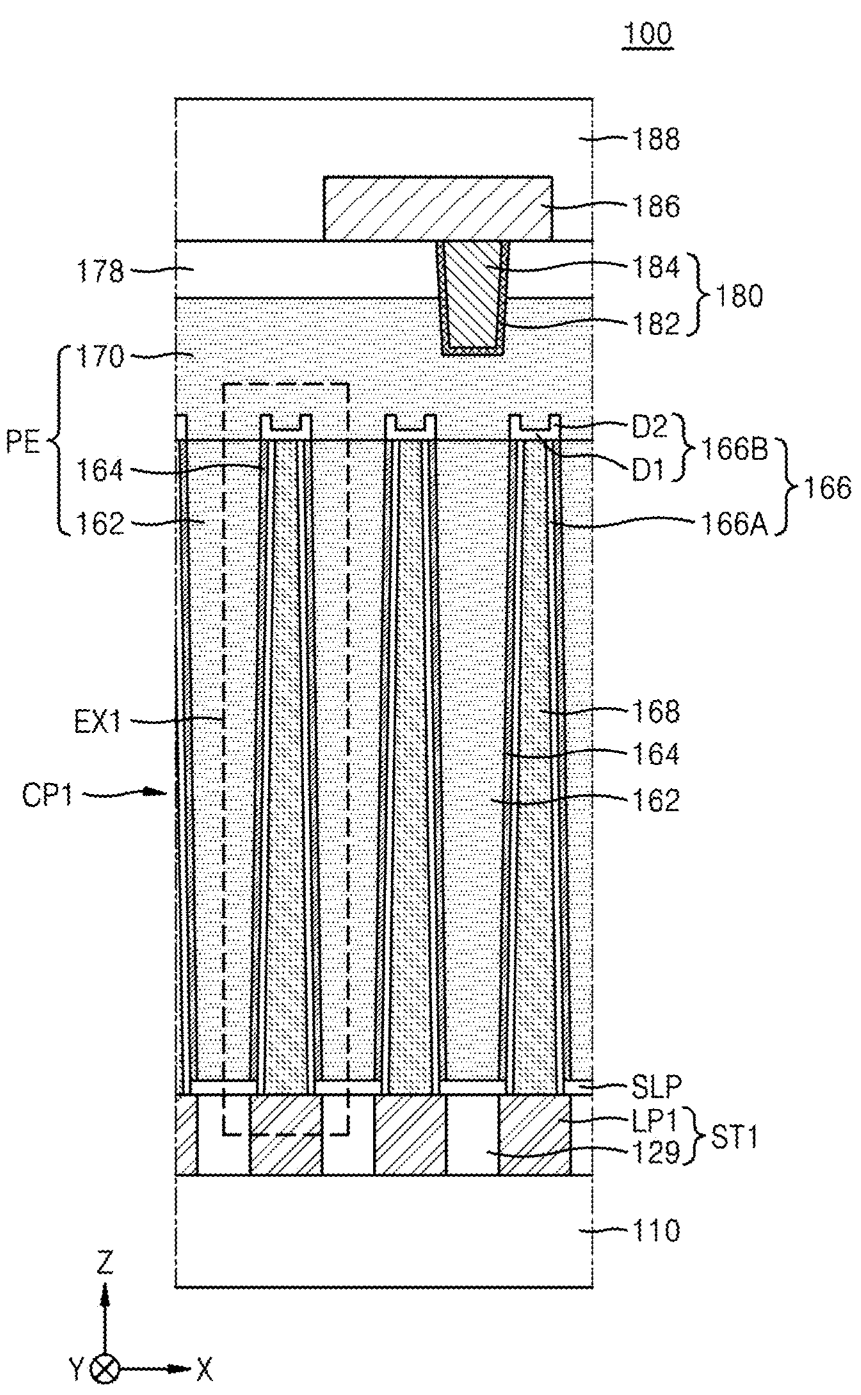
FIG. 4A is a cross-sectional view of an IC device according to embodiments.
Figure 4B:
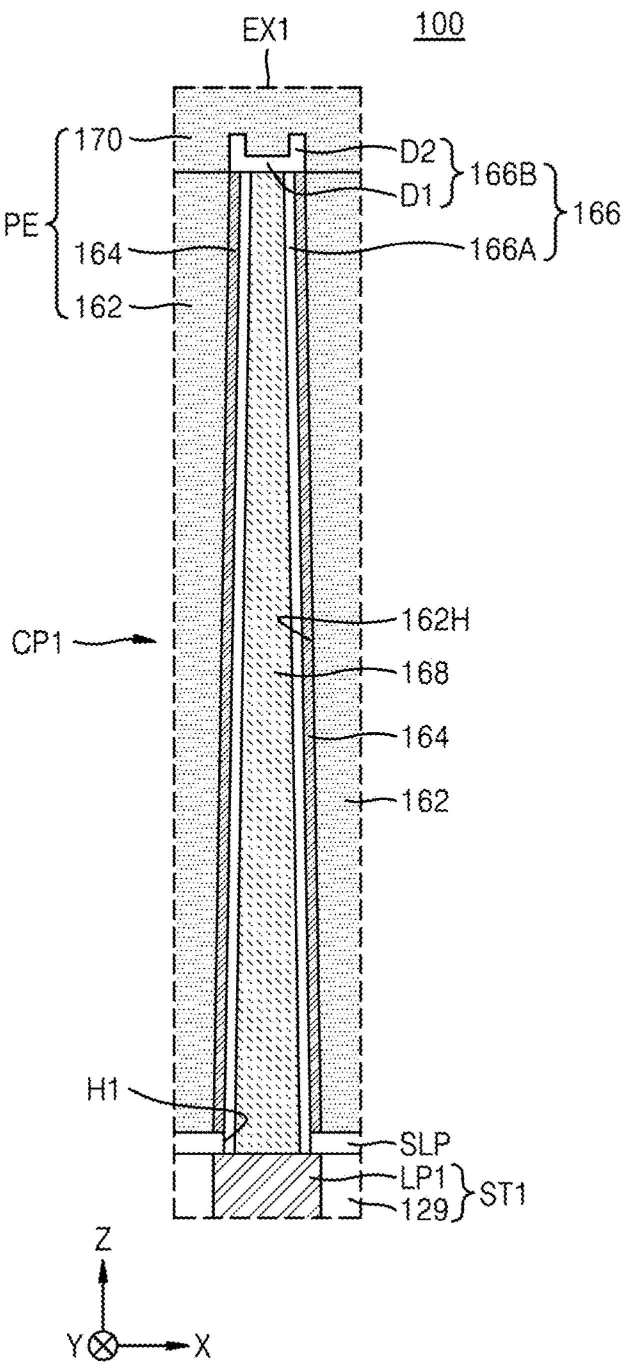
FIG. 4B is an enlarged cross-sectional view of a dashed region "EX1" of FIG. 4A.
Figure 4C:
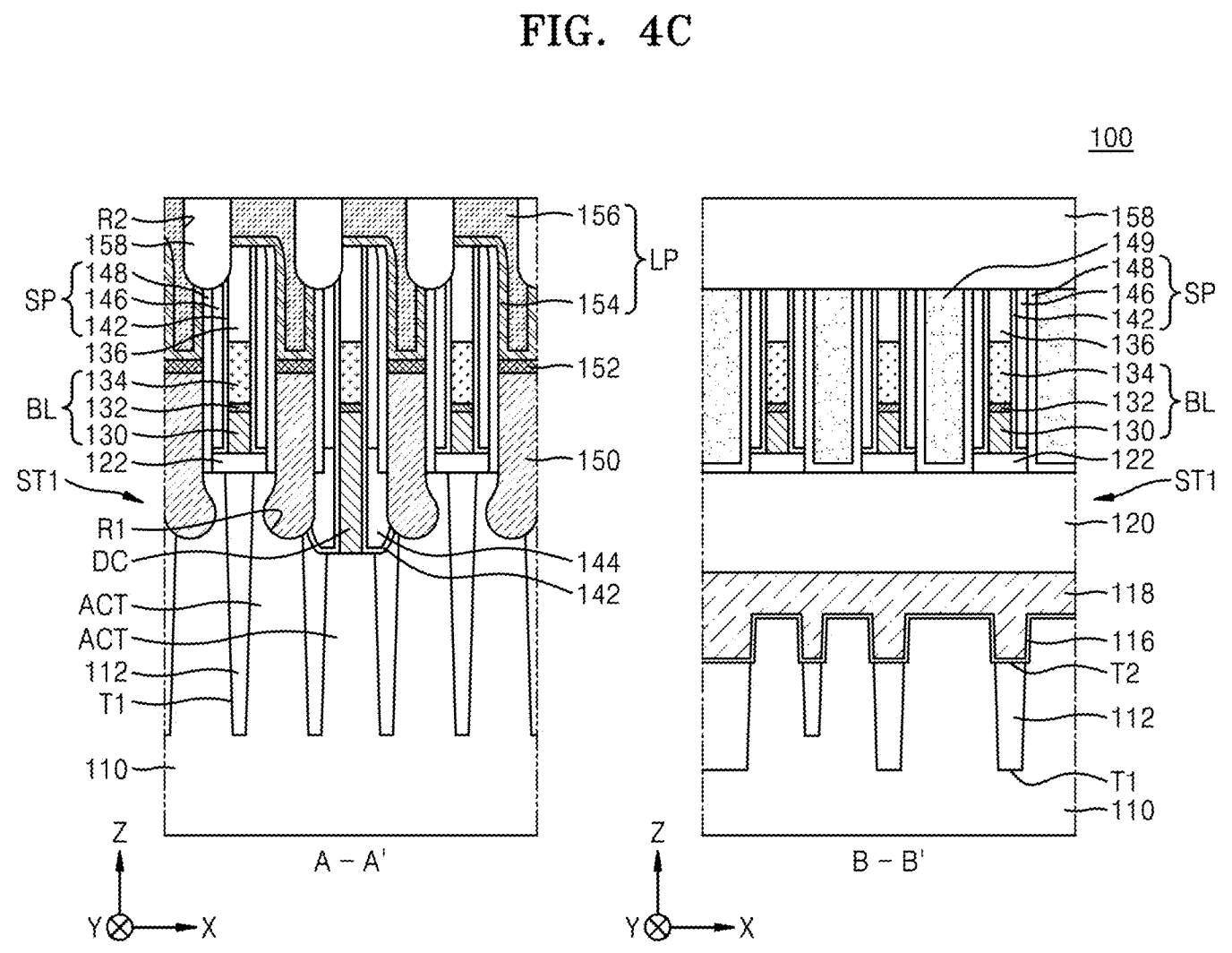

FIG. 4A is a cross-sectional view of an IC device 100 according to embodiments. FIG. 4B is an enlarged cross-sectional view of a dashed region "EX1" of FIG. 4A. FIG. 4C is a detailed cross-sectional view of a lower structure ST1 shown in FIG. 4A. Some components in a portion corresponding to cross-sections taken along lines A-A' and B-B' of FIG. 3 are illustrated in FIG. 4C. Components of the IC device 100 shown in FIGS. 4A to 4C may constitute a portion of the memory cell array 22A of the IC device 10 shown in FIGS. 1 to 3. Some components of the IC device 100 are omitted or briefly illustrated in FIG. 4A. However, a configuration of the IC device 100 is not limited to that shown in FIG. 4A and may be interpreted as including characteristic configurations as described below.

Referring to FIGS. 4A to 4C, the IC device 100 may include a substrate 110, the lower structure ST1 on the substrate 110, and a plurality of capacitors CP1 on the lower structure ST1.

The substrate 110 may be a portion of the substrate 12 shown in FIG. 1. The substrate 110 may include the plurality of active areas ACT shown in FIG. 3. The lower structure ST1 may include a plurality of conductive areas LP1 and a plurality of insulating structures 129 configured to insulate the plurality of conductive areas LP1 from each other. Each of the plurality of conductive areas LP1 may be connected to the active area (refer to ACT in FIG. 4C) included in the substrate 110.

The substrate 110 may include silicon, for example, single crystalline silicon, polycrystalline silicon, or amorphous silicon. For example, the substrate 110 may include a semiconductor element (e.g., silicon (Ge) and germanium (Ge)) or a compound semiconductor (e.g., SiGe, SiC, GaAs, InAs, and InP).

The substrate 110 may include a semiconductor substrate, at least one insulating film formed on the semiconductor substrate, or structures including at least one conductive area. The conductive area may include, for example, a doped well or a doped structure. The substrate 110 may include a plurality of active areas (refer to ACT in FIGS. 3 and 4C) defined by a device isolation film (refer to 112 in FIG. 4C).

In the lower structure ST1, the plurality of insulating structures 129 may include an insulating film including a silicon oxide film, a silicon nitride film, or a combination thereof. In other embodiments, the plurality of insulating structures 129 may include an insulating film configured to insulate various conductive areas (e.g., wiring layers, contact plugs, and transistors) from each other.

In the lower structure ST1, each of the plurality of conductive areas LP1 may include polysilicon, a metal, a conductive metal nitride, a metal silicide, or a combination thereof. The plurality of conductive areas LP1 may include the plurality of bit lines BL described with reference to FIG. 3. The plurality of conductive areas LP1 may respectively include a plurality of buried contacts BC and a plurality of conductive landing pads LP, which have been described with reference to FIG. 3.

A bottom insulating pattern SLP may be on the lower structure ST1. The bottom insulating pattern SLP may extend in a lateral direction (e.g., a direction parallel to an X-Y plane of FIG. 4A) on the plurality of conductive areas LP1. A plurality of openings H1 may be formed in the bottom insulating pattern SLP. The bottom insulating pattern SLP may include a silicon nitride (SiN) film, a silicon carbonitride (SiCN) film, a silicon boron nitride (SiBN) film, or a combination thereof. As used herein, each of the terms "SiN," "SiCN," and "SiBN" refers to a material including elements included therein, without referring to a chemical formula representing a stoichiometric relationship.

A plurality of capacitors CP1 may be respectively on the plurality of conductive areas LP1. On the substrate 110, the plurality of capacitors CP1 may be at a second vertical level that is higher than a first vertical level at which the plurality of conductive areas LP1 are arranged. As used herein, the term "vertical level" may refer to a height obtained in a vertical direction (Z direction or −Z direction). The plurality of capacitors CP1 may be respectively connected to the plurality of conductive areas LP1.

The plurality of capacitors CP1 may include a plurality of first electrodes 168, a second electrode PE, and a plurality of dielectric films 166. The second electrode PE may include a SiGe film 162 having a plurality of holes 162H. Each of the plurality of first electrodes 168 may be contained inside one of the plurality of holes 162H formed in the SiGe film 162. Each of the plurality of dielectric films 166 may include a first dielectric film 166A between the plurality of first electrodes 168 and the second electrode PE inside the hole 162H of the SiGe film 162. The SiGe film 162 of the second electrode PE may surround a sidewall of each of the plurality of first electrodes 168 with the first dielectric film 166A therebetween.

Each of the plurality of first electrodes 168 may have a pillar shape, which passes through the bottom insulating pattern SLP via an opening H1 and extends long in a direction away from the substrate 110 in a vertical direction (Z direction). Each of the plurality of first electrodes 168 may have a bottom surface in contact with a top surface of a selected one of the plurality of conductive areas LP1 to be connected to the conductive area LP1, which is selected. Each of the plurality of first electrodes 168 may have a width that gradually increases toward the substrate 110.

Each of the plurality of first electrodes 168 may include a metal film, a conductive metal oxide film, a conductive metal nitride film, a conductive metal oxynitride film, or a combination thereof. In embodiments, each of the plurality of first electrodes 168 may include titanium (Ti), Ti oxide, Ti nitride, Ti oxynitride, cobalt (Co), Co oxide, Co nitride, Co oxynitride, niobium (Nb), Nb oxide, Nb nitride, Nb oxynitride, tin (Sn), Sn oxide, Sn nitride, Sn oxynitride, or a combination thereof. For example, each of the plurality of first electrodes 168 may include titanium nitride (TiN), cobalt nitride (CoN), niobium nitride (NbN), tin oxide ($SnO_2$), or a combination thereof, without being limited thereto.

Each of the plurality of dielectric films 166 may further include a second dielectric film 166B in contact with a top surface of the first dielectric film 166A. The first dielectric film 166A and the second dielectric film 166B may be at different distances from the substrate 110. The first dielectric film 166A may be closer to the substrate 110 than the second dielectric film 166B. The first dielectric film 166A may be between the first electrode 168 and the SiGe film 162 of the second electrode PE and cover the sidewall of the first electrode 168. The second dielectric film 166B may cover an uppermost surface of each of the first electrode 168 and the first dielectric film 166A. The first dielectric film 166A may be in contact with the sidewall of the first electrode 168. The second dielectric film 166B may include a lateral extension D1 and a protrusion D2. The lateral extension D1 may be in contact with the uppermost surface of the first electrode 168. The protrusion D2 may be integrally connected to the lateral extension D1 and extend from the lateral extension D1 in a direction away from the substrate 110. The first dielectric film 166A of each of the plurality of dielectric films 166 may include a portion between the first electrode 168 and the bottom insulating pattern SLP. The second dielectric film 166B of each of the plurality of dielectric films 166 may be farther away from the substrate 110 than the SiGe film 162, the first dielectric film 166A, and the first electrode 168.

An additional support film configured to support the plurality of first electrodes 168 may be between every two adjacent ones of the plurality of first electrodes 168. Accordingly, each of a plurality of first dielectric films 166A included in the plurality of dielectric films 166 may be continuously in contact with the sidewall of the first electrode 168 from a vertical level of a lowermost surface of the first electrode 168 to a vertical level of the uppermost surface of the first electrode 168. Furthermore, in the SiGe film 162, a sidewall of each of the plurality of holes 162H inside which the plurality of first electrodes 168 and the plurality of first dielectric films 166A are respectively contained may continuously extend without being cut off or bent from the vertical level of the lowermost surface of the first electrode 168 to the vertical level of the uppermost surface of the first electrode 168.

In the second electrode PE, a lowermost surface of the SiGe film 162 may be in contact with a top surface of the bottom insulating pattern SLP. Between two adjacent ones of the plurality of first electrodes 168, the SiGe film 162 may continuously extend without being cut off in the vertical direction (Z direction) from the lowermost surface of the SiGe film 162 to an uppermost surface of the SiGe film 162.

The plurality of dielectric films 166 may include a high-k dielectric film. As used herein, the term "high-k dielectric film" may refer to a dielectric film having a higher dielectric constant than a silicon oxide film. In embodiments, the plurality of first dielectric films 166A and a plurality of second dielectric films 166B, which are in the plurality of dielectric films 166, may each include a metal oxide including at least one metal selected from hafnium (Hf), zirconium (Zr), aluminum (Al), niobium (Nb), cerium (Ce), lanthanum (La), tantalum (Ta), and titanium (Ti). In embodiments, the plurality of first dielectric films 166A and the plurality of second dielectric films 166B, which are in the plurality of dielectric films 166, may each include a single structure including one high-k dielectric film. In other embodiments, the plurality of first dielectric films 166A and the plurality of second dielectric films 166B, which are in the plurality of dielectric films 166, may each include a multilayered structure including a plurality of high-k dielectric films. The high-k dielectric film may include $HfO_2$, $ZrO_2$, $Al_2O_3$, $La_2O_3$, $Ta_2O_3$, $Nb_2O_5$, $CeO_2$, $TiO_2$, $GeO_2$, or a combination thereof, without being limited thereto. In embodiments, in the plurality of dielectric films 166, each of the plurality of first dielectric films 166A and the plurality of second dielectric films 166B may have a thickness of about 20 Å to about 80 Å, without being limited thereto.

In the second electrode PE, the SiGe film 162 may include a component of which a content varies according to a distance from the substrate 110. As used herein, the term "content" may refer to an atom ratio or a concentration expressed as the number of atoms per unit volume. In embodiments, the SiGe film 162 may have a Ge content, which gradually reduces toward the substrate 110. For example, the SiGe film 162 may include a doped SiGe film, and a Ge content of the doped SiGe film may gradually reduce toward the substrate 110. The doped SiGe film may include a SiGe film doped with boron (B) atoms, without being limited thereto. In other embodiments, the SiGe film 162 may include at least one dopant selected from a fluorine (F) atom and a hydrogen (H) atom, and a content of the at least one dopant in the SiGe film 162 may gradually increase toward the substrate 110. In this case, the Ge content of the SiGe film 162 may be constant entirely over the SiGe film 162 or gradually reduce toward the substrate 110. The SiGe film 162 may further include a boron (B) atom in addition to the fluorine (F) atom and the hydrogen (H) atom. In this case, a content of boron (B) atoms in the SiGe film 162 may be constant entirely over the SiGe film 162.

In embodiments, the SiGe film 162 may include a $Si_{1-x}Ge_x$ film (here, $0.05 \leq x \leq 0.70$), which is doped with boron (B) atoms. For example, the Ge content of the SiGe film 162 may be in a range of about 5 atom % (at %) to about 70 at %, or a range of about 40 at % to about 60 at %, without being limited thereto. A concentration of boron (B) atoms in the SiGe film 162 may be selected in a range of about 1E11 atoms/$cm^3$ to about 5E22 atoms/$cm^3$, without being limited thereto.

In other embodiments, the SiGe film 162 may include at least one dopant selected from a fluorine (F) atom, a hydrogen (H) atom, and a boron (B) atom. When the SiGe film 162 includes fluorine (F) atoms, a concentration of fluorine (F) atoms in the SiGe film 162 may be selected in a range of about 1E11 atoms/$cm^3$ to about 5E22 atoms/$cm^3$, without being limited thereto. When the SiGe film 162 includes hydrogen (H) atoms, a concentration of hydrogen (H) atoms in the SiGe film 162 may be selected in a range of about 1E11 atoms/$cm^3$ to about 5E22 atoms/$cm^3$, without being limited thereto. When the SiGe film 162 includes boron (B) atoms, a concentration of boron (B) atoms in the SiGe film 162 may be selected in a range of about 1E11 atoms/$cm^3$ to about 5E22 atoms/$cm^3$, without being limited thereto.

The SiGe film 162 may be at the same vertical level as the plurality of first electrodes 168. Each of the plurality of first electrodes 168 may pass through a selected one of the plurality of openings H1 formed in the bottom insulating pattern SLP in the vertical direction (Z direction) and be connected to a selected one of the plurality of conductive areas LP1.

Each of the plurality of holes 162H formed in the SiGe film 162 may have a width that gradually increases toward the substrate 110 in the lateral direction. Thus, a partial region of the SiGe film 162 (e.g., a partial region of the SiGe film 162 between two adjacent ones of the plurality of first electrodes 168) may have a width that gradually reduces toward the substrate 110 in the lateral direction.

The second electrode PE may further include a plurality of conductive metal-containing patterns 164. Each of the plurality of conductive metal-containing patterns 164 may be between a selected one of the plurality of first dielectric films 166A and the SiGe film 162. A lowermost surface of each of the plurality of conductive metal-containing patterns 164 may be in contact with the top surface of the bottom insulating pattern SLP.

Each of the plurality of conductive metal-containing patterns 164 may be in contact with an inner wall of the hole 162H of the SiGe film 162. Each of the plurality of conductive metal-containing patterns 164 may have a hollow pipe shape. The inside of each of the plurality of conductive metal-containing patterns 164 may be filled with the first electrode 168 and the first dielectric film 166A. The first dielectric film 166A inside the hole 162H of the SiGe film 162 may have a hollow pipe shape. An outer wall of the first dielectric film 166A may be in contact with an inner wall of the conductive metal-containing pattern 164. The inside of the first dielectric film 166A may be filled with the first electrode 168, and an inner wall of the first dielectric film 166A may be in contact with the first electrode 168. One first electrode 168, one first dielectric film 166A, and one conductive metal-containing pattern 164 may be covered by one second dielectric film 166B.

Each of the plurality of conductive metal-containing patterns 164 may include a metal film, a conductive metal oxide film, a conductive metal nitride film, a conductive metal oxynitride film, or a combination thereof. In embodiments, each of the plurality of conductive metal-containing patterns 164 may include Ti, Ti oxide, Ti nitride, Ti oxynitride, Co, Co oxide, Co nitride, Co oxynitride, Nb, Nb oxide, Nb nitride, Nb oxynitride, Sn, Sn oxide, Sn nitride, Sn oxynitride, or a combination thereof. For example, each of the plurality of conductive metal-containing patterns 164 may include TiN, CoN, NbN, $SnO_2$, or a combination thereof, without being limited thereto.

The second electrode PE may further include an outer SiGe film 170 covering the SiGe film 162. The outer SiGe film 170 may cover the uppermost surface of each of the plurality of dielectric films 166 and the SiGe film 162. The outer SiGe film 170 may be in contact with a top surface of the SiGe film 162 and the plurality of second dielectric films 166B included in the plurality of dielectric films 166. A Ge content of the outer SiGe film 170 may be constant regardless of a distance from the substrate 110.

In embodiments, the outer SiGe film 170 may include a SiGe film doped with at least one dopant. The at least one dopant may be selected from a boron (B) atom, a fluorine (F) atom, and a hydrogen (H) atom. A content of the at least one dopant included in the outer SiGe film 170 may be constant regardless of a distance from the substrate 110.

In embodiments, the outer SiGe film 170 may include a $Si_{1-x}Ge_x$ film (here, $0.05 \leq x \leq 0.70$), which is doped with boron (B) atoms. For example, the Ge content of the outer SiGe film 170 may be in a range of about 5 at % to about 70 at % or a range of about 40 at % to about 60 at %, without being limited thereto. A concentration of boron (B) atoms in the outer SiGe film 170 may be selected in a range of about 1E11 atoms/cm$^3$ to about 5E22 atoms/cm$^3$, without being limited thereto.

In other embodiments, the outer SiGe film 170 may include at least one dopant selected from a fluorine (F) atom, a hydrogen (H) atom, and a boron (B) atom. When the outer SiGe film 170 includes fluorine (F) atoms, a concentration of fluorine (F) atoms in the outer SiGe film 170 may be selected in a range of about 1E11 atoms/cm$^3$ to about 5E22 atoms/cm$^3$, without being limited thereto. When the outer SiGe film 170 includes hydrogen (H) atoms, a concentration of hydrogen (H) atoms in the outer SiGe film 170 may be selected in a range of about 1E11 atoms/cm$^3$ to about 5E22 atoms/cm$^3$, without being limited thereto. When the outer SiGe film 170 includes boron (B) atoms, a concentration of boron (B) atoms in the outer SiGe film 170 may be selected in a range of about 1E11 atoms/cm$^3$ to about 5E22 atoms/cm$^3$, without being limited thereto.

The lower structure ST1 shown in FIG. 4A may include the same structure as that shown in FIG. 4C.

Referring to FIG. 4C, the substrate 110 may include a plurality of active areas ACT defined by the device isolation film 112. The device isolation film 112 may be formed inside the device isolation trench T1 formed in the substrate 110. The device isolation film 112 may include an oxide film, a nitride film, or a combination thereof. In the substrate 110, a word line trench T2 may be formed long in a first lateral direction (X direction) across the device isolation film 112 and the plurality of active areas ACT. A step may be formed in a bottom surface of the word line trench T2.

A gate dielectric film 116, a word line 118, and a buried insulating film 120 may be inside the word line trench T2. The word line 118 may correspond to the plurality of word lines WL shown in FIG. 1. The gate dielectric film 116 may include at least one selected from a silicon oxide film, a silicon nitride film, a silicon oxynitride film, an oxide/nitride/oxide (ONO) film, or a high-k dielectric film having a higher dielectric constant than the silicon oxide film. The high-k dielectric film may include $HfO_2$, $Al_2O_3$, $HfAlO_3$, $Ta_2O_3$, $TiO_2$, or a combination thereof. A plurality of word lines 118 may include titanium (Ti), titanium nitride (TiN), tantalum (Ta), tantalum nitride (TaN), tungsten (W), tungsten nitride (WN), titanium silicon nitride (TiSiN), tungsten silicon nitride (WSiN), or a combination thereof. A plurality of buried insulating films 120 may include a silicon oxide film, a silicon nitride film, a silicon oxynitride film, or a combination thereof. A plurality of source/drain regions may be respectively formed on both sides of the plurality of word lines 118 in the plurality of active areas ACT.

A buffer layer 122 may be formed on the substrate 110. The buffer layer 122 may cover top surfaces of the plurality of active areas ACT and a top surface of the device isolation film 112. The buffer layer 122 may include a first silicon oxide film, a silicon nitride film, and a second silicon oxide film, which are sequentially formed on the substrate 110, without being limited thereto.

A plurality of bit lines BL may be on the buffer layer 122 and extend parallel to each other in a second lateral direction (Y direction). The plurality of bit lines BL may be apart from each other in the first lateral direction (X direction). A direct contact DC may be on a partial region of each of the plurality of active areas ACT. Each of the plurality of bit lines BL may be connected to the active area ACT through the direct contact DC. The direct contact DC may include silicon (Si), germanium (Ge), tungsten (W), tungsten nitride (WN), cobalt (Co), nickel (Ni), aluminum (Al), molybdenum (Mo), ruthenium (Ru), titanium (Ti), titanium nitride (TiN), tantalum (Ta), tantalum nitride (TaN), copper (Cu), or a combination thereof. In embodiments, the direct contact DC may include doped polysilicon.

Each of the plurality of bit lines BL may include a lower conductive layer 130, a middle conductive layer 132, and an upper conductive layer 134, which are sequentially formed on the substrate 110. A top surface of each of the plurality of bit lines BL may be covered by an insulating capping pattern 136. The insulating capping pattern 136 may be on the upper conductive layer 134. A top surface of the lower conductive layer 130 of the bit line BL may be coplanar with a top surface of the direct contact DC. FIG. 4C illustrates an example in which each of the plurality of bit lines BL has a triple conductive layer structure including the lower conductive layer 130, the middle conductive layer 132, and the upper conductive layer 134, but inventive concepts are not limited thereto. For example, each of the plurality of bit lines BL may include a single conductive layer, a double conductive layer, or a stack structure of a plurality of conductive layers (e.g., four or more conductive layers).

In embodiments, the lower conductive layer 130 may include a doped polysilicon film. Each of the middle conductive layer 132 and the upper conductive layer 134 may include a film including titanium (Ti), titanium nitride (TiN), titanium silicon nitride (TiSiN), tungsten (W), tungsten nitride (WN), tungsten silicide ($WSi_x$), tungsten silicon nitride ($WSi_xN_y$), ruthenium (Ru), or a combination thereof. For example, the middle conductive layer 132 may include a TiN film and/or a TiSiN film, and the upper conductive layer 134 may include a film including Ti, TiN, W, WN, $WSi_xN_y$, Ru, or a combination thereof. The insulating capping pattern 136 may include a silicon nitride film.

A plurality of recess spaces R1 may be formed in the active area ACT in a partial region of the substrate 110. The plurality of recess spaces R1 may be respectively filled with a plurality of contact plugs 150. Each of the plurality of contact plugs 150 may have a pillar shape extending from the recess space R1 in the vertical direction (Z direction). Each of the plurality of contact plugs 150 may be in contact with the active area ACT. A lower end of each of the plurality of contact plugs 150 may be at a lower level than a top surface of the substrate 110 and buried in the substrate 110. The plurality of contact plugs 150 may include a doped semiconductor pattern, without being limited thereto.

In the IC device 100, one direct contact DC and a pair of contact plugs 150, which face each other with the one direct contact DC therebetween, may be respectively connected to different active areas AC, from among the plurality of active areas AC.

A plurality of conductive plugs 150 may be arranged in a line in the second lateral direction (Y direction) between a pair of bit lines BL, which are selected from the plurality of bit lines BL and adjacent to each other. An insulating fence 149 may be between every two adjacent ones of the plurality of contact plugs 150, which are arranged in a row in the second lateral direction (Y direction). The plurality of contact plugs 150 may be insulated from each other by a plurality of insulating fences 149. Each of the plurality of insulating fences 149 may have a pillar shape extending in the vertical direction (Z direction) on the substrate 110. In embodiments, the plurality of insulating fences 149 may include a silicon nitride film.

A plurality of metal silicide films 152 and a plurality of conductive landing pads LP may be on the plurality of contact plugs 150. Each of the plurality of conductive landing pads LP may extend long in the vertical direction (Z direction) on the contact plug 150. The plurality of conductive landing pads LP may be respectively connected to the plurality of contact plugs 150 through a metal silicide film 152. Each of the plurality of conductive landing pads LP may include a conductive barrier film 154 and a metal film 156. In embodiments, the conductive barrier film 154 may include Ti, TiN, or a combination thereof, and the metal film 156 may include tungsten (W). The plurality of conductive landing pads LP may have a plurality of island-type pattern shapes in a view from above. In embodiments, the metal silicide film 152 may include cobalt silicide, nickel silicide, or manganese silicide, without being limited thereto.

The contact plug 150 and the metal silicide film 152 may constitute the buried contact BC shown in FIG. 3. The contact plug 150, the metal silicide film 152, and the conductive landing pad LP, which are sequentially on the substrate 110, may constitute a contact structure, which are adjacent to the bit line BL in the first lateral direction (X direction) and connected to the active area ACT of the substrate 110. The plurality of conductive areas LP1 shown in FIG. 4A may include the contact plug 150, the metal silicide film 152, and the conductive landing pad LP, which are shown in FIG. 4C. Each of the plurality of first electrodes 168 shown in FIG. 4A may be in contact with a top surface of the conductive landing pad LP shown in FIG. 4C.

Both sidewalls of each of the plurality of bit lines BL and both sidewalls of each of a plurality of insulating capping patterns 136 covering top surfaces of the plurality of bit lines BL may be covered by a spacer structure SP. One spacer structure SP may be between a selected one of the plurality of bit lines BL and a plurality of contact plugs 150 that are adjacent to the one bit line BL, which is selected, and arranged in a line in the second lateral direction (Y direction) Each of a plurality of spacer structures SP may include an inner insulating spacer 142, a middle insulating spacer 146, and an outer insulating spacer 148.

The inner insulating spacer 142 may be in contact with each of a sidewall of the bit line BL and a sidewall of the direct contact DC. The inner insulating spacer 142 may include a portion in contact with the contact plug 150. The inner insulating spacer 142 may include a silicon nitride film. The middle insulating spacer 146 may be between the inner insulating spacer 142 and the outer insulating spacer 148 in the first lateral direction (X direction). The middle insulating spacer 146 may have a sidewall facing the bit line BL with the inner insulating spacer 142 therebetween and a sidewall facing the contact plug 150, the metal silicide film 152, and the conductive landing pad LP with the outer insulating spacer 148 therebetween. The middle insulating spacer 146 may include a silicon oxide film, an air spacer, or a combination thereof. As used herein, the term "air" may refer to other gases that may be in the atmosphere or during a manufacturing process. The outer insulating spacer 148 may be in contact with a sidewall of each of the contact plug 150, the metal silicide film 152, and the conductive landing pad LP. The outer insulating spacer 148 may be apart from the inner insulating spacer 142 with the middle insulating spacer 146 therebetween. In embodiments, the outer insulating spacer 148 may include a silicon nitride film.

The spacer structure SP may extend parallel to the bit line BL in the second lateral direction (Y direction). The insulating capping pattern 136 and the spacer structure SP may constitute an insulating structure, which covers a top surface and both sidewalls of the bit line BL. As used herein, the insulating capping pattern 136 and the spacer structure SP may be referred to as the insulating structure. As used herein, a structure including the bit line BL, the insulating capping pattern 136, and the spacer structure SP, which are adjacent to each other, may be referred to as a bit line structure.

A gap-fill insulating pattern 144 may be between the direct contact DC and the contact plug 150. The gap-fill insulating pattern 144 may be apart from the direct contact DC with the inner insulating spacer 142 therebetween. The gap-fill insulating pattern 144 may surround the direct contact DC while covering sidewalls of the direct contact DC. The gap-fill insulating pattern 144 may be in contact with the inner insulating spacer 142 and the contact plug 150. In embodiments, the gap-fill insulating pattern 144 may include a silicon nitride film.

An insulating pattern 158 may be formed on insulating structures including the plurality of insulating capping patterns 136 and the plurality of spacer structures SP. The plurality of conductive landing pads LP may be insulated from each other by the insulating pattern 158. The insulating pattern 158 may include a surface in contact with the insulating structure, a surface in contact with the plurality of insulating fences 149, and a surface in contact with a sidewall of the conductive landing pad LP. In embodiments, the plurality of insulating structures 129 shown in FIGS. 4A and 4B may include the plurality of insulating capping patterns 136, the plurality of spacer structures SP, the plurality of insulating fences 149, and the insulating pattern 158, which are shown in FIG. 4C. A plurality of capacitors CP1 shown in FIG. 4A may be respectively on the plurality of conductive landing pads LP.

Referring back to FIG. 4A, a capping insulating film 178 and a conductive contact plug 180 may be on the outer SiGe film 170 of the second electrode PE. The conductive contact plug 180 may pass through the capping insulating film 178 in the vertical direction (Z direction) and be in contact with the outer SiGe film 170. A lower portion of the conductive contact plug 180 may be buried in the outer SiGe film 170. A lowermost surface of the conductive contact plug 180 may be at a lower vertical level than a top surface of the outer SiGe film 170.

The conductive contact plug 180 may include a conductive barrier film 182 and a conductive plug 184, which are sequentially stacked on the outer SiGe film 170. In embodiments, the conductive barrier film 182 may include titanium (Ti), tantalum (Ta), tungsten (W), titanium nitride (TiN), tantalum nitride (TaN), tungsten nitride (WN), tungsten carbonitride (WCN), titanium silicon nitride (TiSiN), tantalum silicon nitride (TaSiN), tungsten silicon nitride (WSiN), or a combination thereof. In embodiments, the conductive plug 184 may include W, Cu, Al, Co, Mo, or Ru.

An upper wiring layer 186 may be on the capping insulating film 178 and the conductive contact plug 180, and an interlayer insulating film 188 covering the upper wiring layer 186 and the capping insulating film 178 may be on the upper wiring layer 186. A bottom surface of the upper wiring layer 186 may be in contact with a top surface of the conductive contact plug 180.

In embodiments, the upper wiring layer 186 may include W, Cu, Al, Co, Mo, Ru, Ti, Ta, TiN, TaN, or a combination thereof. For example, the upper wiring layer 186 may include a copper (Cu) film. In embodiments, the interlayer insulating film 188 may include a low-k dielectric film having a low dielectric constant K of about 2.2 to about 3.0. For example, the interlayer insulating film 188 may include a SiOC film or a SiCOH film.

In the IC device 100 described with reference to FIGS. 4A to 4C, the SiGe film 162 included in the second electrode PE may include a plurality of holes 162H, each of which has a structure of which a width in a lateral direction gradually increases toward the substrate 110. In addition, each of the plurality of first electrodes 168 contained inside the plurality of holes 162H may have a structure of which a width in a lateral direction gradually increases toward the substrate 110. Accordingly, the leaning of at least some of the plurality of first electrodes 168 may be limited and/or prevented during the process of manufacturing the IC device 100. As a result, a failure due to a short circuit between adjacent ones of the plurality of first electrodes 168 may be limited and/or prevented.

The IC device 100 described with reference to FIGS. 4A to 4C may not include an additional support film configured to support the plurality of first electrodes 168 around each of the plurality of first electrodes 168. Therefore, there may be no loss of an area covered by the support film, from among the plurality of first electrodes 168, effective areas of the plurality of capacitors CP1 may be increased and/or maximized, and capacitances of the plurality of capacitors CP1 may be increased.

Figure 5:
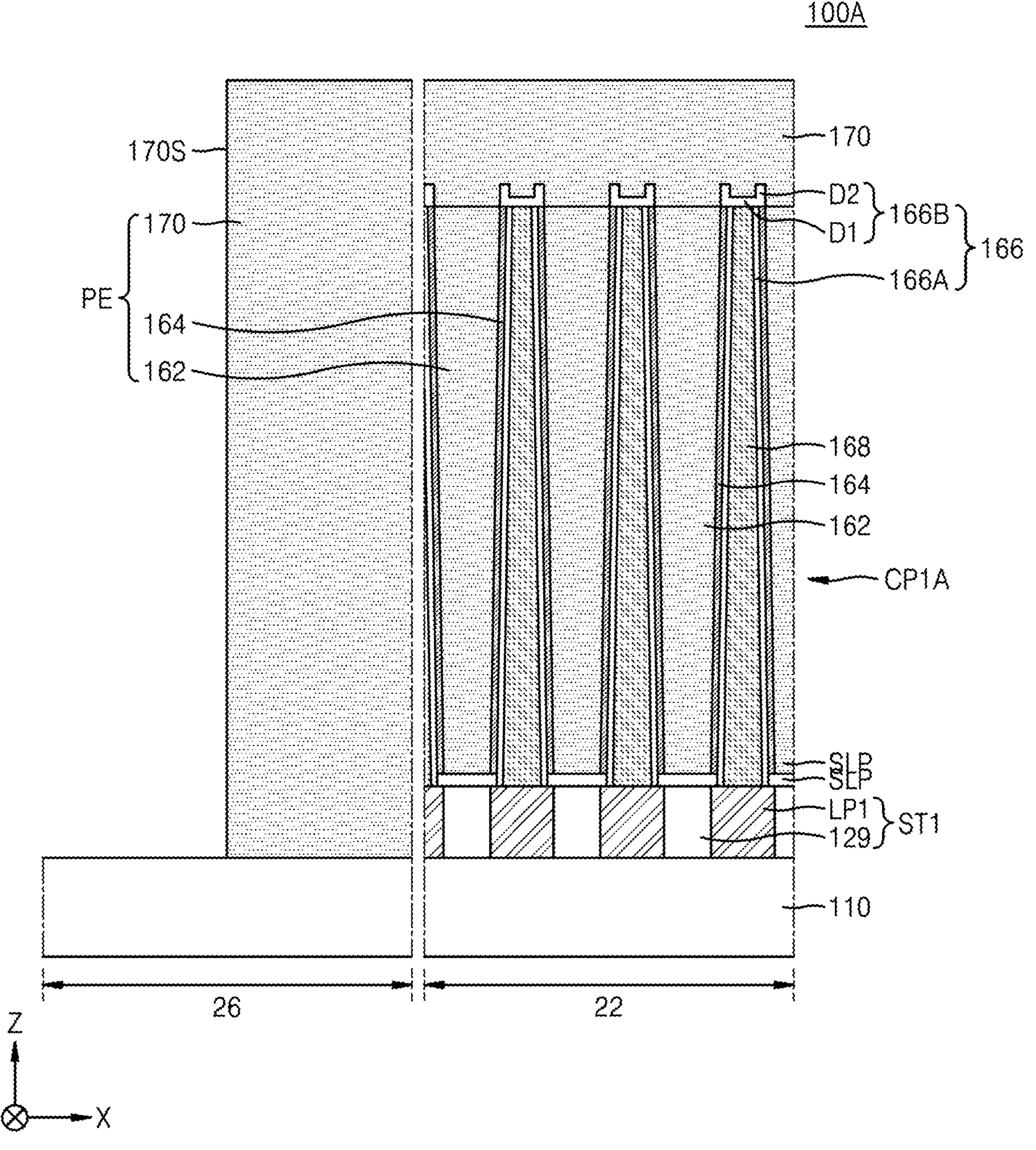
FIG. 5 is a cross-sectional view of an IC device according to embodiments.

FIG. 5 is a cross-sectional view of an IC device 100A according to embodiments. FIG. 5 illustrates components of each of a memory cell area 22 and an interfacial area 26 included in region "NF" of FIG. 1. In FIG. 5, the same reference numerals are used to denote the same elements as in FIGS. 4A to 4C, and detailed descriptions thereof are omitted here.

Referring to FIG. 5, the memory cell area 22 of the IC device 100A may substantially have the same configuration as that of the IC device 100 described with reference to FIGS. 4A to 4C. However, the IC device 100A may include a plurality of capacitors CP1A instead of the plurality of capacitors CP1 shown in FIGS. 4A and 4B. The plurality of capacitors CP1A may substantially have the same configuration as the plurality of capacitors CP1 described with reference to FIGS. 4A and 4B. However, in the IC device 100A, an outer SiGe film 170 may have an outermost surface 170S, which constitutes an outermost portion of a capacitor structure including the plurality of capacitors CP1A in a lateral direction. The outermost surface 170S of the outer SiGe film 170 may be in a portion of the interfacial area 26, which is adjacent to the memory cell area 22. The outermost surface 170S of the outer SiGe film 170 may planarly extend in a vertical direction (Z direction) without a step in a vertical level region in which a plurality of first electrodes 168 and a SiGe film 162 are arranged. For example, in a vertical level region from a lowermost surface of each of the plurality of first electrodes 168 to an uppermost surface thereof, the outermost surface 170S of the outer SiGe film 170 may planarly extend in the vertical direction (Z direction) without a protrusion in the lateral direction.

In a comparative example, when an additional support film configured to support the plurality of first electrodes 168 is between every two adjacent ones of the plurality of first electrodes 168, the support film may include portions, which protrude into the interfacial area 26 from a sidewall of an outermost one of the plurality of first electrodes 168 located in the memory cell area 22. When the outer SiGe film 170 is formed to cover the support film in the resultant structure, portions of the outer SiGe film 170 may locally protrude from the memory cell area 22 toward the interfacial area 26. As a result, an area occupied by the outer SiGe film 170 in the lateral direction may increase, and thus, the number of effective cells in the memory cell area 22 may be reduced.

Conversely, the IC device 100A shown in FIG. 5 may not include a support film that may cause portions of the outer SiGe film 170 to locally protrude from the memory cell area 22 toward the interfacial area 26. Thus, in the IC device 100A, in the vertical level region from the lowermost surface of each of the plurality of first electrodes 168 to the uppermost surface thereof, the outermost surface 170S of the outer SiGe film 170 may have a structure that planarly extends in the vertical direction (Z direction) without a protrusion in the lateral direction. Accordingly, in the IC device 100A, an increase in the planar areas of the plurality of capacitors CP1A due to the support film and the resultant increase in the planar area of the outer SiGe film 170 may be limited and/or suppressed. As a result, the number of effective cells arranged in the memory cell area 22 may be increased. Therefore, the integration density of the IC device 100A may be improved. In addition, the IC device 100A shown in FIG. 5 may provide the same effects as the effects of the IC device 100, which have been described with reference to FIGS. 4A to 4C.

Figure 6A:
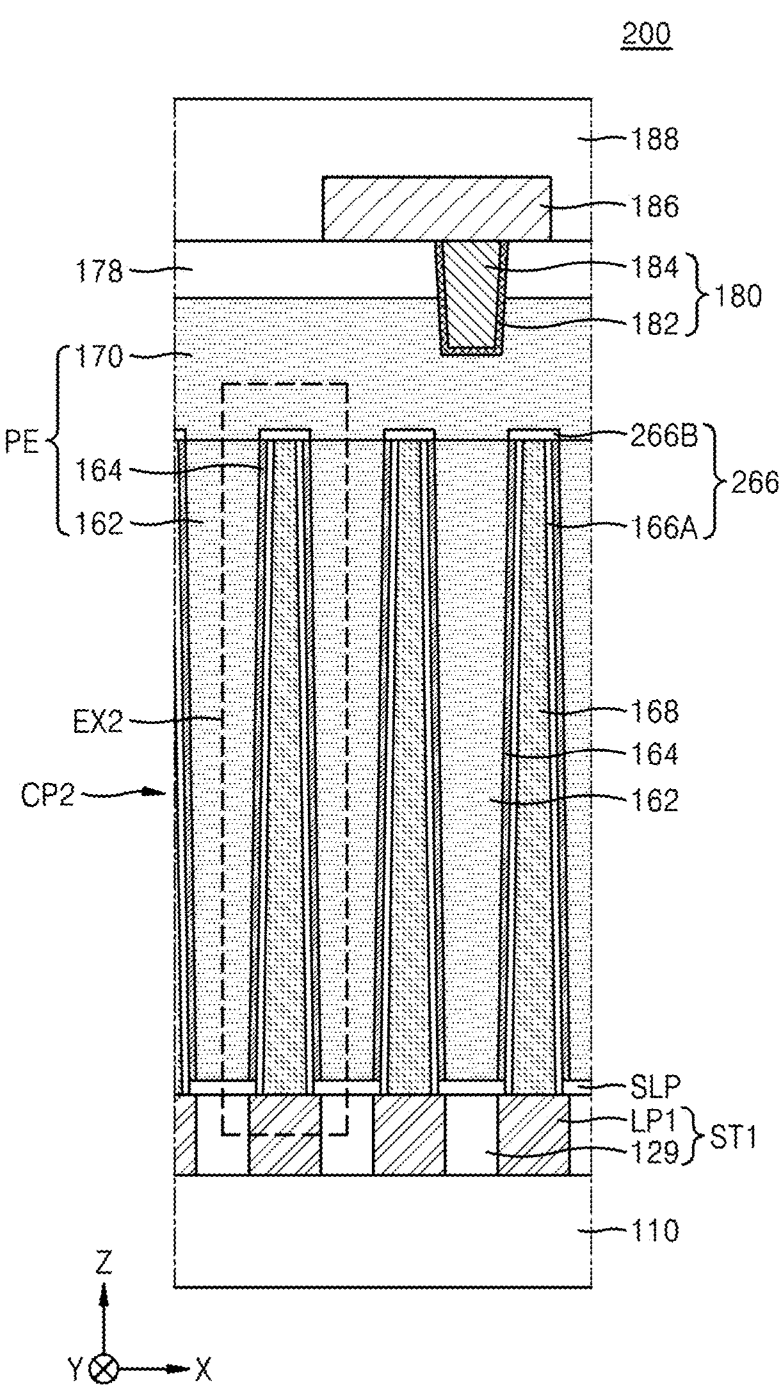
FIG. 6A is a cross-sectional view of an IC device according to embodiments.
Figure 6B:
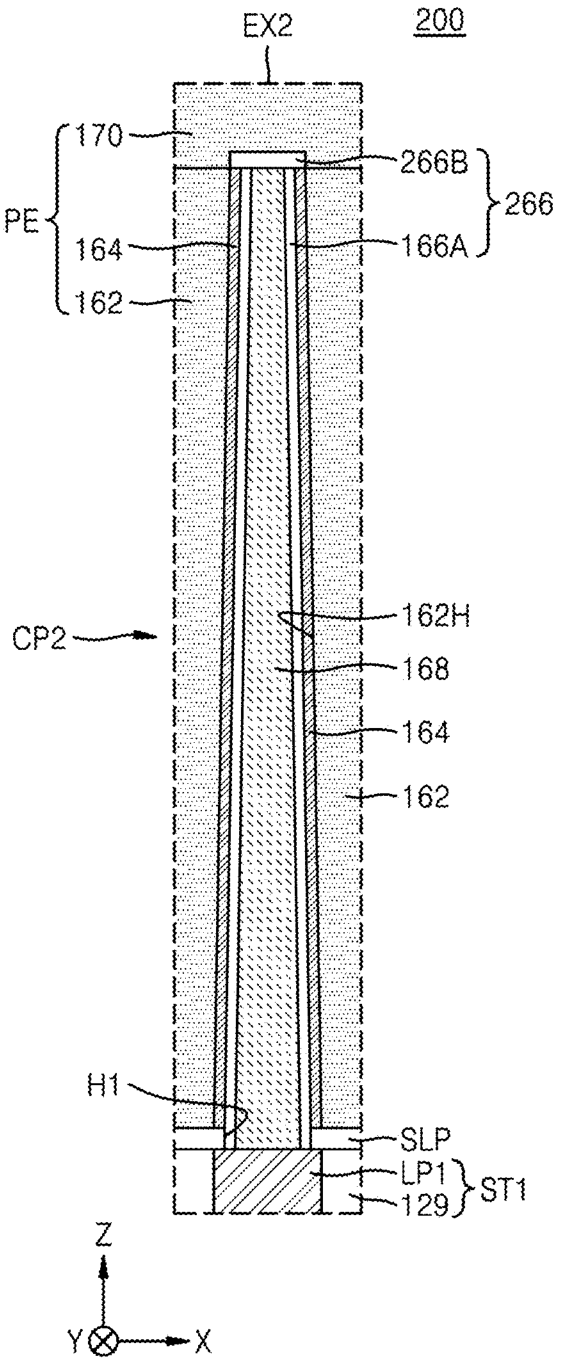
FIG. 6B is an enlarged cross-sectional view of a dashed region "EX2" of FIG. 6A.

FIG. 6A is a cross-sectional view of an IC device 200 according to embodiments. FIG. 6B is an enlarged cross-sectional view of a dashed region "EX2" of FIG. 6A. In FIGS. 6A and 6B, the same reference numerals are used to denote the same elements as in FIGS. 4A to 4C, and detailed descriptions thereof are omitted here.

Referring to FIGS. 6A and 6B, the IC device 200 may substantially have the same configuration as the IC device 100 described with reference to FIGS. 4A to 4C. However, the IC device 200 may include a plurality of capacitors CP2 instead of the plurality of capacitors CP1 shown in FIGS. 4A and 4B. The plurality of capacitors CP2 may substantially have the same configuration as the plurality of capacitors CP1 described with reference to FIGS. 4A and 4B. However, the plurality of capacitors CP2 may include a plurality of dielectric films 266.

Each of the plurality of dielectric films 266 may further include a first dielectric film 166A and a second dielectric film 266B in contact with a top surface of the first dielectric film 166A. The first dielectric film 166A and the second dielectric film 266B may be at different distances from the substrate 110. The first dielectric film 166A may be closer to the substrate 110 than the second dielectric film 266B. The first dielectric film 166A may have the same configuration as that described with reference to FIGS. 4A and 4B. The second dielectric film 266B may cover an uppermost surface of each of the first electrode 168 and the first dielectric film 166A. The second dielectric film 266B may have a bottom surface in contact with an uppermost surface of the first electrode 168 and a top surface planarly extending in a lateral direction. The second dielectric film 266B may be farther away from the substrate 110 than the SiGe film 162, the first dielectric film 166A, and the first electrode 168. A detailed description of the second dielectric film 266B may substantially have the same configuration as that of the second dielectric film 166B described with reference to FIGS. 4A and 4B.

The IC device 200 shown in FIGS. 6A and 6B may provide effects obtained from the IC device 100 described with reference to FIGS. 4A to 4C and effects obtained from the IC device 100A described with reference to FIG. 5.

Figure 7A:
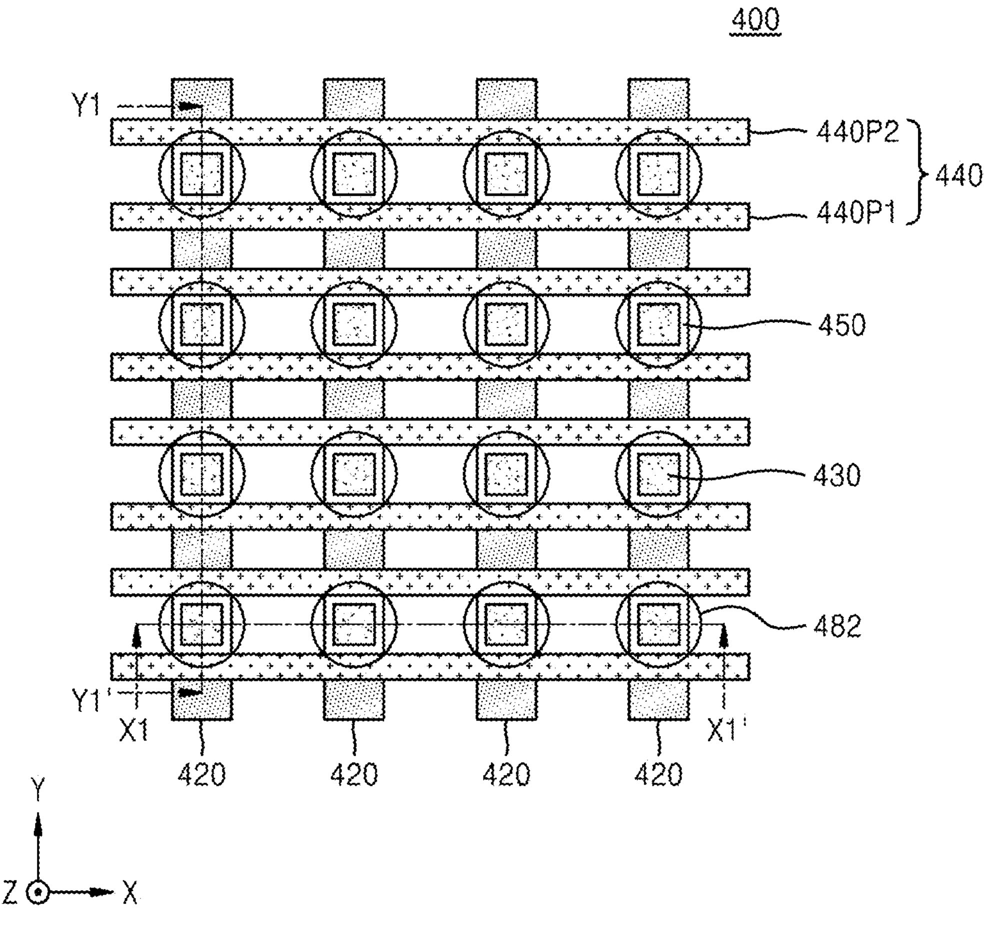
FIG. 7A is a layout diagram of an IC device according to embodiments.
Figure 7B:
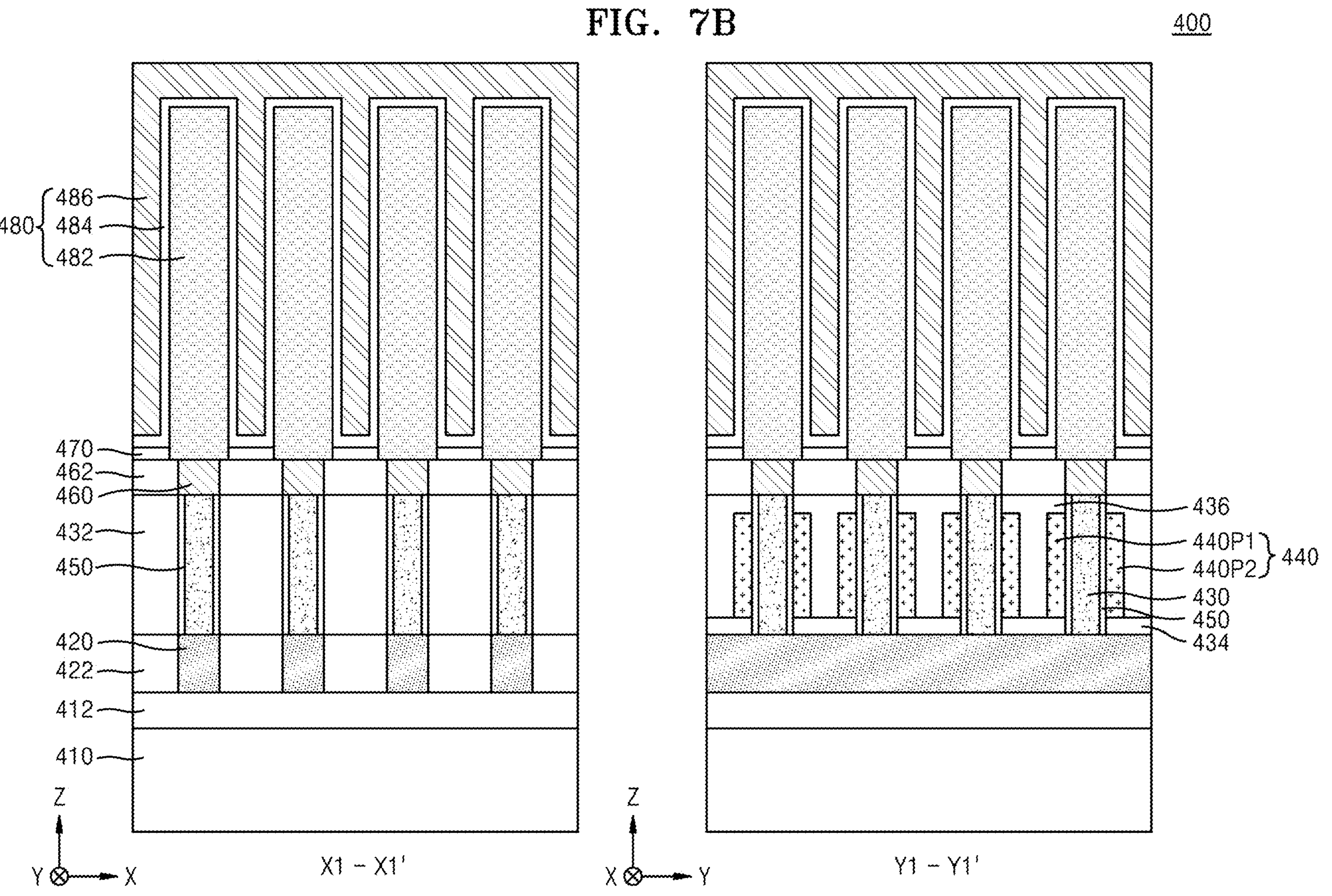
FIG. 7B is a cross-sectional view taken along lines X1-X1' and Y1-Y1' of FIG. 7A.

FIG. 7A is a layout diagram of an IC device 400 according to embodiments. FIG. 7B is a cross-sectional view taken along lines X1-X1' and Y1-Y1' of FIG. 7A.

Referring to FIGS. 7A and 7B, the IC device 400 may include a substrate 410, a plurality of first conductive lines 420, a channel layer 430, a gate electrode 440, a gate insulating layer 450, and a capacitor structure 480. The IC device 400 may be a memory device including a vertical channel transistor (VCT). The VCT may refer to having a structure in which a channel length of the channel layer 430 extends from the substrate 410 in a vertical direction.

A lower insulating layer 412 may be on the substrate 410. On the lower insulating layer 412, the plurality of first conductive lines 420 may be apart from each other in a first lateral direction (X direction) and extend long in a second lateral direction (Y direction). On the lower insulating layer 412, a plurality of first insulating patterns 422 may fill spaces between the plurality of first conductive lines 420. The plurality of first insulating patterns 422 may extend long in the second lateral direction (Y direction), and top surfaces of the plurality of first insulating patterns 422 may be at the same vertical level as top surfaces of the plurality of first conductive lines 420. The plurality of first conductive lines 420 may function as bit lines of the IC device 400.

In embodiments, the plurality of first conductive lines 420 may include a doped polysilicon, a metal, a conductive metal nitride, a conductive metal silicide, a conductive metal oxide, or a combination thereof. For example, the plurality of first conductive lines 420 may include doped polysilicon, aluminum (Al), copper (Cu), titanium (Ti), tantalum (Ta), ruthenium (Ru), tungsten (W), molybdenum (Mo), platinum (Pt), nickel (Ni), cobalt (Co), titanium nitride (TiN), tantalum nitride (TaN), tungsten nitride (WN), niobium nitride (NbN), titanium aluminide (TiAl), titanium aluminum nitride (TiAlN), titanium silicide (TiSi), titanium silicon nitride (TiSiN), tantalum silicide (TaSi), tantalum silicon nitride (TaSiN), ruthenium titanium nitride (RuTiN), nickel silicide (NiSi), cobalt silicide (CoSi), iridium oxide (IrOx), ruthenium oxide (RuOx), or a combination thereof, without being limited thereto. The plurality of first conductive lines 420 may include a single layer or a multilayered structure of the materials described above. In embodiments, the plurality of first conductive lines 420 may include a 2D semiconductor material. The 2D semiconductor material may include graphene, carbon nanotubes, or a combination thereof.

Channel layers 430 may be arranged in a matrix form to be apart from each other in the first lateral direction (X direction) and the second lateral direction (Y direction) on the plurality of first conductive lines 420. Each of the channel layers 430 may have a first width in the first lateral direction (X direction) and a first height in a vertical direction (Z direction), and the first height may be greater than the first width. For example, the first height may be about twice to about ten times the first width, without being limited thereto. A bottom portion of the channel layer 430 may serve as a first source/drain region (not shown), an upper portion of the channel layer 430 may serve as a second source/drain region (not shown), and a portion of the channel layer 430 between the first and second source/drain regions may serve as a channel region (not shown).

In embodiments, the channel layer 430 may include an oxide semiconductor. For example, the oxide semiconductor may include indium gallium zinc oxide (InGaZnO), indium gallium silicon oxide (InGaSiO), indium tin zinc oxide (InSnZnO), indium zinc oxide (InZnO), zinc oxide (ZnO), zinc tin oxide (ZnSnO), zinc oxynitride (ZnON), zirconium zinc tin oxide (ZrZnSnO), tin oxide (SnO), hafnium indium zinc oxide (HfInZnO), gallium zinc tin oxide (GaZnSnO), aluminum zinc tin oxide (AlZnSnO), ytterbium gallium zinc oxide (YbGaZnO), indium gallium oxide (InGaO), or a combination thereof. Herein, the indication of each of the materials listed above refers to a material including elements included therein, without referring to a chemical formula representing a stoichiometric relationship. The channel layer 430 may include a single layer or a multilayered structure of oxide semiconductors. In embodiments, the channel layer 430 may have a higher bandgap energy than silicon. For example, the channel layer 430 may have a bandgap energy of about 1.5 eV to 5.6 eV. For example, the channel layer 430 may have optimal channel performance at a bandgap energy of about 2.0 eV to about 4.0 eV. For example, the channel layer 430 may be polycrystalline or amorphous, without being limited thereto. In embodiments, the channel layer 430 may include a two-dimensional (2D) semiconductor material. For example, the 2D semiconductor material may include graphene, carbon nanotube, or a combination thereof.

The gate electrode 440 may extend on both sidewalls of the channel layer 430 in the first lateral direction (X direction). The gate electrode 440 may include a first sub-gate electrode 440P1 facing a first sidewall of the channel layer 430 and a second sub-gate electrode 440P2 facing a second sidewall, which is opposite to the first sidewall of the channel layer 430. Because one channel layer 430 is between the first sub-gate electrode 440P1 and the second sub-gate electrode 440P2, the IC device 400 may have a dual-gate transistor structure. However, inventive concepts are not limited thereto. The second sub-gate electrode 440P2 may be omitted, and a single-gate transistor structure may be implemented by forming only the first sub-gate electrode 400P1 facing the first sidewall of the channel layer 430.

The gate electrode 440 may include doped polysilicon, a metal, a conductive metal nitride, a conductive metal silicide, a conductive metal oxide, or a combination thereof. For example, the gate electrode 440 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof, without being limited thereto.

The gate insulating layer 450 may surround a sidewall of the channel layer 430 and be between the channel layer 430 and the gate electrode 440. For example, as shown in FIG. 7B, the entire sidewall of the channel layer 430 may be surrounded by the gate insulating layer 450, and a portion of a sidewall of the gate electrode 440 may be in contact with the gate insulating layer 450. In other embodiments, the gate insulating layer 450 may extend in the first lateral direction (X direction), which is a direction in which the gate electrode 440 extends. From among sidewalls of the channel layer 430, two sidewalls facing the gate electrode 440 may be in contact with the gate insulating layer 450.

In embodiments, the gate insulating layer 450 may include a silicon oxide film, a silicon oxynitride film, a high-k dielectric film having a higher dielectric constant than the silicon oxide film, or a combination thereof. The high-k dielectric film may include a metal oxide or a metal oxynitride. For example, the high-k dielectric film that may be used as the gate insulating layer 450 may include $HfO_2$, HfSiO, HfSiON, HfTaO, HfTiO, HfZrO, $ZrO_2$, $Al_2O_3$ or a combination thereof, without being limited thereto.

A plurality of second insulating patterns 432 may extend on the plurality of first insulating patterns 422 in the second lateral direction (Y direction), and the channel layer 430 may be between two adjacent ones of the plurality of second insulating patterns 432. In addition, between two adjacent ones of the second insulating patterns 432, a first buried layer 434 and a second buried layer 436 may be in a space between two adjacent channel layers 430. The first buried layer 434 may be in a bottom portion of the space between the two adjacent ones of the channel layers 430, and the second buried layer 436 may be formed to fill the remaining space between the two adjacent ones of the channel layers 430 on the first buried layer 434. A top surface of the second buried layer 436 may be at the same level as a top surface of the channel layer 430, and the second buried layer 436 may cover a top surface of the gate electrode 440. In another case, the plurality of second insulating patterns 432 may be formed using a material layer continuous with the plurality of first insulating patterns 422, or the second buried layer 436 may be formed using a material layer continuous with the first buried layer 434.

A capacitor contact 460 may be on the channel layer 430. The capacitor contact 460 may vertically overlap the channel layer 430. Capacitor contacts 460 may be arranged apart from each other in a matrix form in the first lateral direction (X direction) and the second lateral direction (Y direction). The capacitor contact 460 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO, RuO or a combination thereof, without being limited thereto. An upper insulating layer 462 may surround a sidewall of the capacitor contact 460 on the plurality of second insulating patterns 432 and the second buried layer 436.

An etch stop film 470 may be on the upper insulating layer 462, and a capacitor structure 480 may be on the etch stop film 470. The capacitor structure 480 may include a lower electrode 482, a capacitor dielectric layer 484, and an upper electrode 486.

The lower electrode 482 may be electrically connected to a top surface of the capacitor contact 460 by passing through the etch stop film 470. The lower electrode 482 may be formed as a pillar type extending in the vertical direction (Z direction), without being limited thereto. In embodiments, the lower electrode 482 may vertically overlap the capacitor contact 460. Lower electrodes 482 may be arranged apart from each other in a matrix form in the first lateral direction (X direction) and the second lateral direction (Y direction). In another case, a landing pad (not shown) may be further provided between the capacitor contact 460 and the lower electrode 482, and thus, the lower electrodes 482 may be arranged in a hexagonal shape.

In embodiments, the lower electrode 482, the capacitor dielectric layer 484, and the upper electrode 486 may respectively have substantially the same structures as the first electrode 168, the dielectric film 166 or 266, and the SiGe film 162 of the second electrode PE, which are shown in FIGS. 4A, 4B, 5, 6A, and 6B.

Figure 8A:
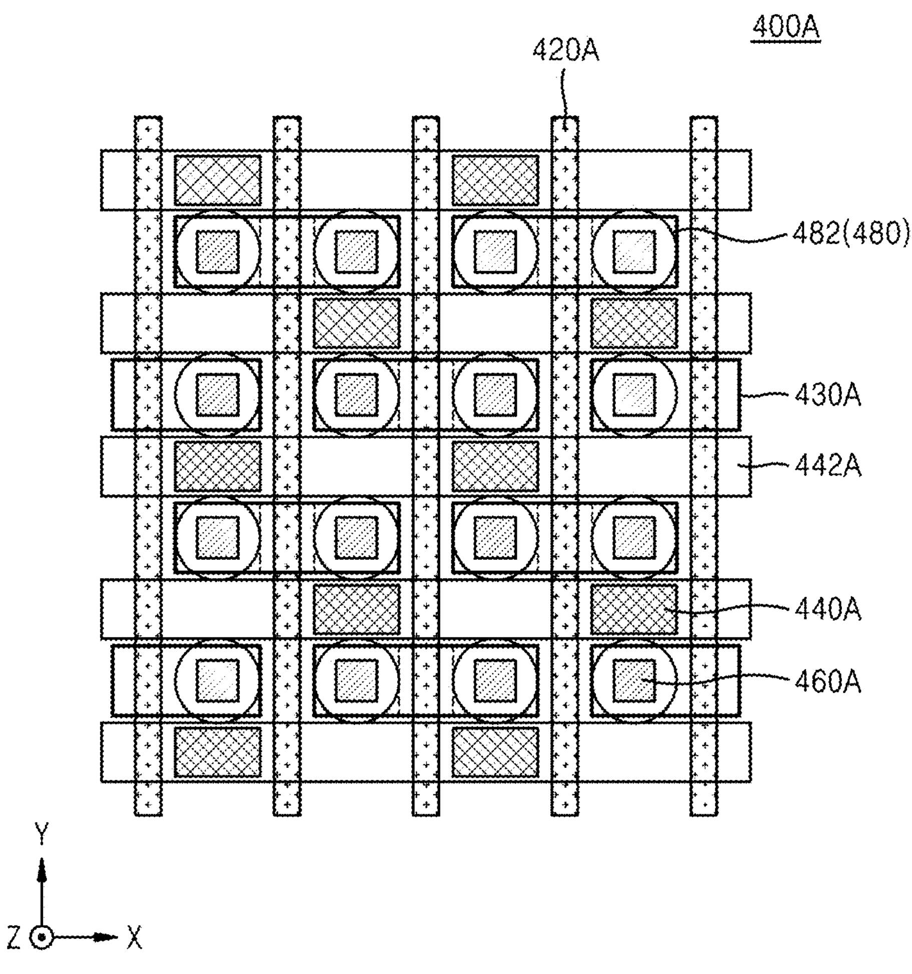
FIG. 8A is a cross-sectional view of an IC device according to embodiments.
Figure 8B:
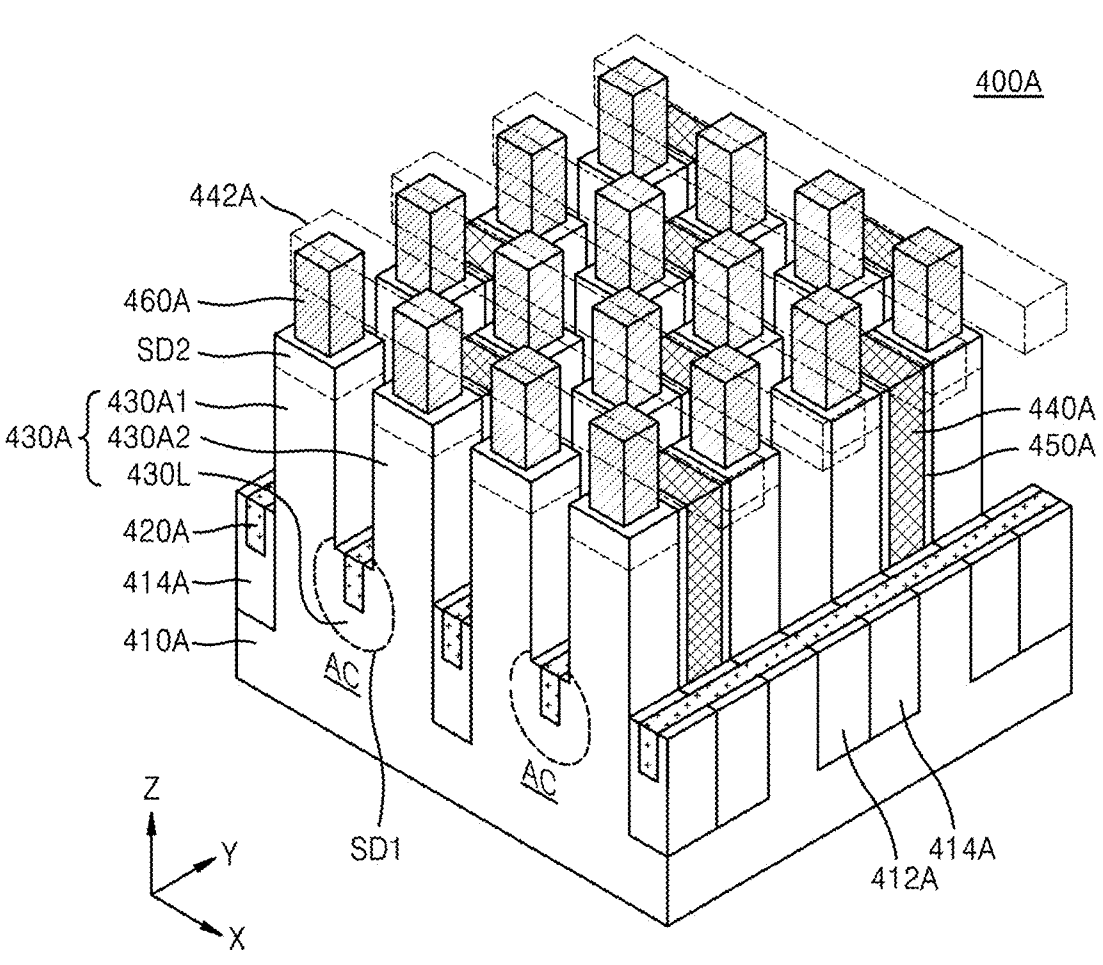
FIG. 8B is a perspective view of the IC device shown in FIG. 8A.

FIG. 8A is a layout diagram of an IC device 400A according to embodiments, and FIG. 8B is a perspective view of the IC device 400A shown in FIG. 8A.

Referring to FIGS. 8A and 8B, the IC device 400A may include a substrate 410A, a plurality of first conductive lines 420A, a channel structure 430A, a contact gate electrode 440A, a plurality of second conductive lines 442A, and a capacitor structure 480. The IC device 400A may be a memory device including a VCT.

A plurality of active areas AC, which are defined by a first device isolation film 412A and a second device isolation film 414A, may be formed in the substrate 410A. The channel structure 430A may be in each of the active areas AC. The channel structure 430A may include a first active pillar 430A1 and a second active pillar 430A2, each of which extends in a vertical direction, and a connection portion 430L, which are connected to a bottom portion of the first active pillar 430A1 and a bottom portion of the second active pillar 430A2. A first source/drain region SD1 may be in the connection portion 430L, and a second source/drain region SD2 may be at an upper side of each of the first and second active pillars 430A1 and 430A2. Each of the first active pillar 430A1 and the second active pillar 430A2 may constitute an independent unit memory cell.

Each of the plurality of first conductive lines 420A may extend long in a direction intersecting with each of the plurality of active areas AC. For example, the plurality of first conductive lines 420A may extend long a second lateral direction (Y direction). One of the plurality of first conductive lines 420A may be on the connection portion 430L between the first active pillar 430A1 and the second active pillar 430A2. The one first conductive line 420A may be on the first source/drain region SD1. Another first conductive line 420A, which is adjacent to the one first conductive line 420A, may be between two channel structures 430A. One of the plurality of first conductive lines 420A may function as a common bit line included in two unit memory cells including the first active pillar 430A1 and the second active pillar 430A2, which are on both sides of the one first conductive line 420A.

One contact gate electrode 440A may be between two channel structures 430A, which are adjacent to each other in the second lateral direction (Y direction). For example, the contact gate electrode 440A may be between the first active pillar 430A1 of one channel structure 430A and the second active pillar 430A2 of another channel structure 430A, which is adjacent thereto. One contact gate electrode 440A may be shared between the first active pillar 430A1 and the second active pillar 430A2, which are respectively on both sidewalls of the one contact gate electrode 440A. A gate insulating layer 450A may be between the contact gate electrode 440A and the first active pillar 430A1 and between the contact gate electrode 440A and the second active pillar 430A2. The plurality of second conductive lines 442A may extend in a first lateral direction (X direction) on a top surface of the contact gate electrode 440A. The plurality of second conductive lines 442A may function as word lines of the IC device 400A.

A capacitor contact 460A may be on the channel structure 430A. The capacitor contact 460A may be on the second source/drain region SD2, and a capacitor structure 480 may be on the capacitor contact 460A.

The capacitor structure 480 may include the plurality of capacitors CP1 described with reference to FIGS. 4A and 4B, the plurality of capacitors CP1A described with reference to FIG. 5, or the plurality of capacitors CP2 described with reference to FIGS. 6A and 6B.

Figure 9:
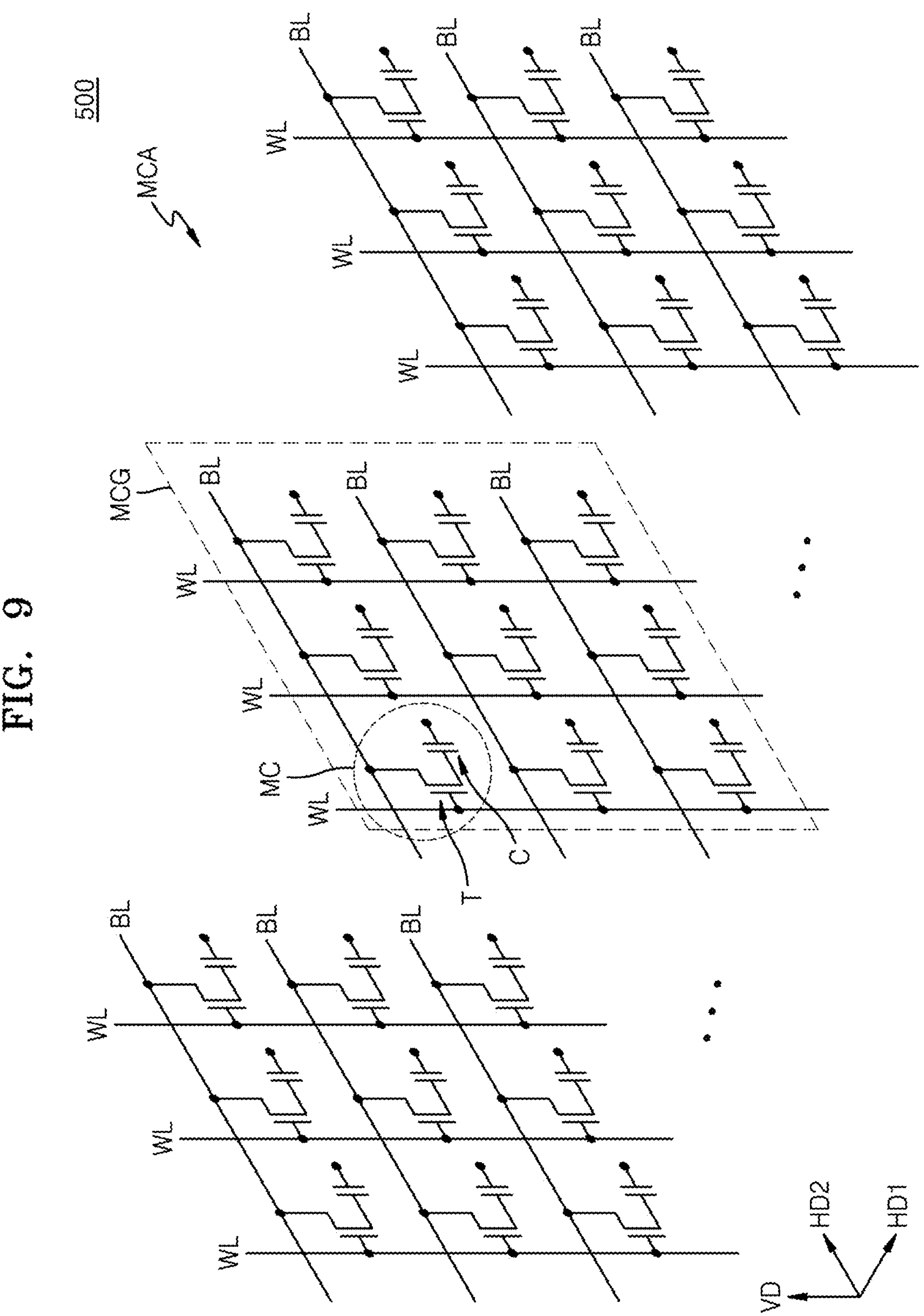
FIG. 9 is a circuit diagram of a circuit configuration of a memory cell array of an IC device according to embodiments.

FIG. 9 is a circuit diagram of a circuit configuration of a memory cell array MCA of an IC device 500 according to embodiments.

Referring to FIG. 9, the IC device 500 may include the memory cell array MCA. The memory cell array MCA may include a plurality of memory cells MC, which are repeatedly arranged in a first lateral direction HD and a second lateral direction HD2, which are perpendicular to each other, and a vertical direction VD.

The memory cell array MCA may include a plurality of memory cell groups MCG including the plurality of memory cells MC, which are two-dimensionally arranged in the second lateral direction HD2 and the vertical direction VD. The plurality of memory cell groups MCG may be repeatedly arranged in the first lateral direction HD1.

The memory cell array MCA may include a plurality of word lines WL and a plurality of bit lines BL, which constitute the plurality of memory cells MC. In one memory cell group MCG, a plurality of bit lines BL may extend parallel to each other in the second lateral direction (HD2 direction) and be apart from each other in the vertical direction (VD direction). In one memory cell group MCG, a plurality of word lines WL may extend parallel to each other in the vertical direction VD and be apart from each other in the second lateral direction (HD2 direction).

A transistor T may be between one word line WL and one bit line BL. A gate of each of a plurality of transistors T included in the memory cell array MCA may be connected to the word line WL, and a source of each of the plurality of transistors T may be connected to the bit line BL. A drain of each of the plurality of transistors T may be connected to a capacitor C.

FIG. 9 illustrates an example in which each of the plurality of memory cells MC includes one transistor T and one capacitor C, but inventive concepts are not limited thereto. For example, each of the plurality of memory cells MC may include a plurality of transistors.

Figure 10A:
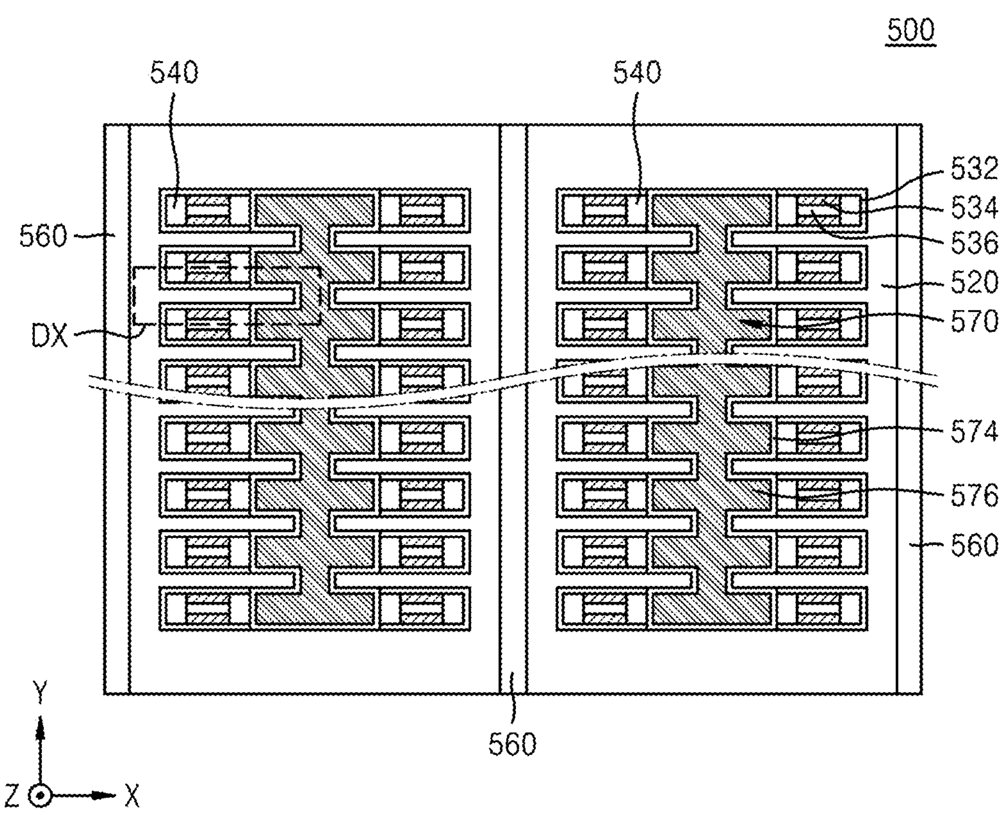
FIG. 10A is a plan view of a partial region of an IC device according to embodiments.
Figure 10B:
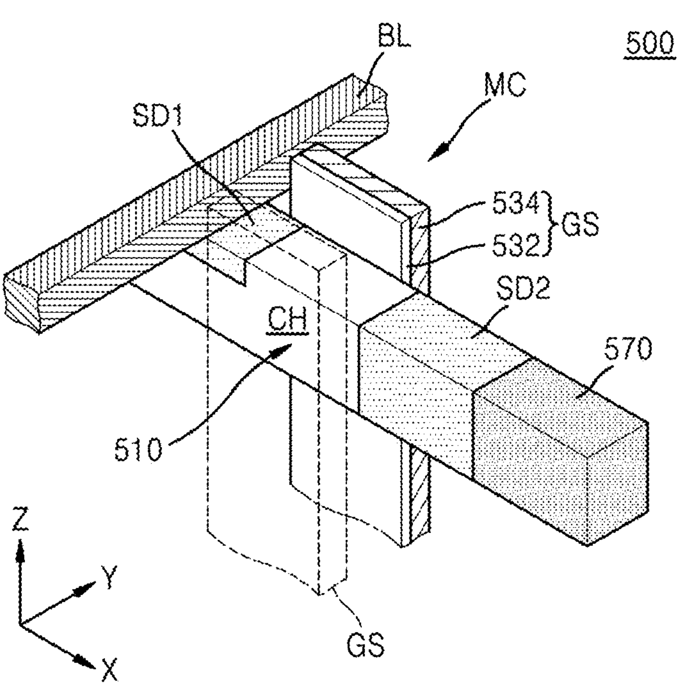
FIG. 10B is a partial enlarged perspective view of some components of region "DX" of FIG. 10A.

FIGS. 10A and 10B are diagrams of an IC device 500, according to embodiments. FIG. 10A is a plan view of a partial region of the IC device 500, and FIG. 10B is a partial enlarged perspective view of some components of region "DX" of FIG. 10A. The IC device 500 shown in FIGS. 10A and 10B may constitute the memory cell array 22A of the IC device 10 shown in FIG. 2.

Referring to FIGS. 10A and 10B, the IC device 500 may include a plurality of memory cells MC, which are repeatedly arranged on a substrate in a first lateral direction (X direction) and a second lateral direction (Y direction), which are perpendicular to each other, and in a vertical direction (Z direction). Each of the plurality of memory cells MC may include a plurality of semiconductor layers 510, which extend long in the first lateral direction (X direction). Each of the plurality of semiconductor layers 510 may include a first source/drain region SD1 and a second source/drain region SD2, which are apart from each other in the first lateral direction (X direction), and a channel region CH therebetween. The substrate may substantially have the same configuration as the substrate 110 described with reference to FIGS. 4A and 4B.

Each of the plurality of semiconductor layers 510 may have a thickness that is in a range of about 5 nm to about 500 nm in the vertical direction (Z direction). For example, each of the plurality of semiconductor layers 510 may have a thickness that is selected in a range of about 10 nm to about 100 nm.

Each of the plurality of semiconductor layers 510 may have a pillar shape that extends long in the first lateral direction (X direction). The IC device 500 may include a plurality of gate lines 534, which extend long in the vertical direction (Z direction) on the substrate to face both sidewalls of each of the plurality of semiconductor layers 510. The plurality of gate lines 534 may constitute the plurality of word lines WL shown in FIG. 9.

A gate insulating film 532 may be between the gate line 534 and the channel region CH of the semiconductor layer 510. The gate insulating film 532 and the gate line 534, which face the sidewalls of each of the plurality of semiconductor layers 510, may constitute a gate structure GS. One memory cell MC may include a pair of gate structures GS, which are apart from each other with the channel region CH of the semiconductor layer 510 therebetween, and the pair of gate structures GS may symmetrically face each other about the channel region CH. In the IC device 500, one memory cell MC may have a transistor having a double-gate structure including one semiconductor layer 510 and two gate lines 534 covering both sidewalls of the channel region CH included in the one semiconductor layer 510.

The gate insulating film 532 may include a stack structure of an interfacial film and a high-k dielectric film. The interfacial film may include a low-k dielectric material film having a dielectric constant of about 9 or less, for example, a silicon oxide film, a silicon oxynitride film, or a combination thereof. In some embodiments, the interfacial film may be omitted. The high-k dielectric film may include a material having a higher dielectric constant than a silicon oxide film. For example, the high-k dielectric film may have a dielectric constant of about 10 to about 25. The high-k dielectric film may include hafnium oxide, hafnium silicon oxide, zirconium oxide, zirconium silicon oxide, or a combination thereof, but a constituent material of the high-k dielectric film is not limited thereto.

Each of the plurality of gate lines 534 may include doped semiconductor, a metal, a conductive metal nitride, conductive metal carbide, or a combination thereof. The metal may be selected from titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd). The conductive metal nitride may be selected from TiN and TaN. The conductive metal carbide may be titanium aluminum carbide (TiAlC). In embodiments, the plurality of gate lines 534 may include a stack structure of a conductive barrier film and a metal film. For example, the conductive barrier film may include TiN or TaN, and the metal film may include tungsten (W).

The IC device 500 may include a plurality of middle insulating films (not shown), which are respectively one-by-one between the plurality of semiconductor layers 510, which overlap each other in the vertical direction (Z direction). The plurality of middle insulating films may overlap the plurality of semiconductor layers 510 in the vertical direction (Z direction). Each of the plurality of middle insulating films may include a silicon oxide film, a silicon nitride film, a silicon oxynitride film, a carbon-containing silicon oxide film, a carbon-containing silicon nitride film, a carbon-containing silicon oxynitride film, or a combination thereof.

The IC device 500 may include a capacitor structure 570, which is in contact with one end of each of the plurality of semiconductor layers 510 in the first lateral direction (X direction). The capacitor structure 570 may include the plurality of capacitors CP1 described with reference to FIGS. 4A and 4B, the plurality of capacitors CP1A described with reference to FIG. 5, or the plurality of capacitors CP2 described with reference to FIGS. 6A and 6B.

The capacitor structure 570 may include a dielectric film 574 and an electrode layer 576. The dielectric film 574 may substantially have the same structure as the dielectric film 166 or 266 described with reference to FIGS. 4A, 4B, 5, 6A, and 6B. The electrode layer 576 may substantially have the same structure as the SiGe film 162 described with reference to FIGS. 4A, 4B, 5, 6A, and 6B.

The plurality of gate lines 534 may include two gate lines 534, which are between two semiconductor layers 510, which are adjacent to each other in the second lateral direction (Y direction), and a space between the two gate lines 534 may be filled by a buried insulating film 536. As shown in FIG. 10A, a plurality of vertical insulating patterns 540 may be between the gate line 534 and the capacitor structure 570. The plurality of vertical insulating patterns 540 may cover both sidewalls of the gate line 534 in the first lateral direction (X direction) and both sidewalls of the buried insulating film 536 in the first lateral direction (X direction).

A bit line BL may be on the second source/drain region SD2. The bit line BL may be covered by a bit line buried insulating film 560. Each of the bit line BL and the bit line buried insulating film 560 may extend long in the second lateral direction (Y direction). In embodiments, the bit line BL may include doped polysilicon, a metal, a conductive metal nitride, a metal silicide, or a combination thereof. The metal silicide may include tungsten silicide, cobalt silicide, or titanium silicide. Each of the buried insulating film 536, the vertical insulating pattern 540, and the bit line buried insulating film 560 may include a silicon oxide film, a silicon nitride film, or a silicon oxynitride film.

Hereinafter, a method of manufacturing IC devices, according to embodiments, will be described.

FIGS. 11A to 11J and 12A to 12K are cross-sectional views of a process sequence of a method of manufacturing an IC device, according to embodiments. FIGS. 11A to 11J show cross-sectional views of some components of a partial region corresponding to the cross-section taken along the lines A-A' and B-B' of FIG. 3, according to a process sequence. An example method of manufacturing the IC device 100 shown in FIGS. 4A to 4C will be described with reference to FIGS. 11A to 11J and 12A to 12K. In FIGS. 11A to 11J and 12A to 12K, the same reference numerals are used to denote the same elements as in FIGS. 4A to 4C, and detailed descriptions thereof are omitted here.

To begin with, a method of forming the lower structure ST1 shown in FIGS. 4A and 4C on a substrate 110 will be described with reference to FIGS. 11A to 11J.

Figure 11A:
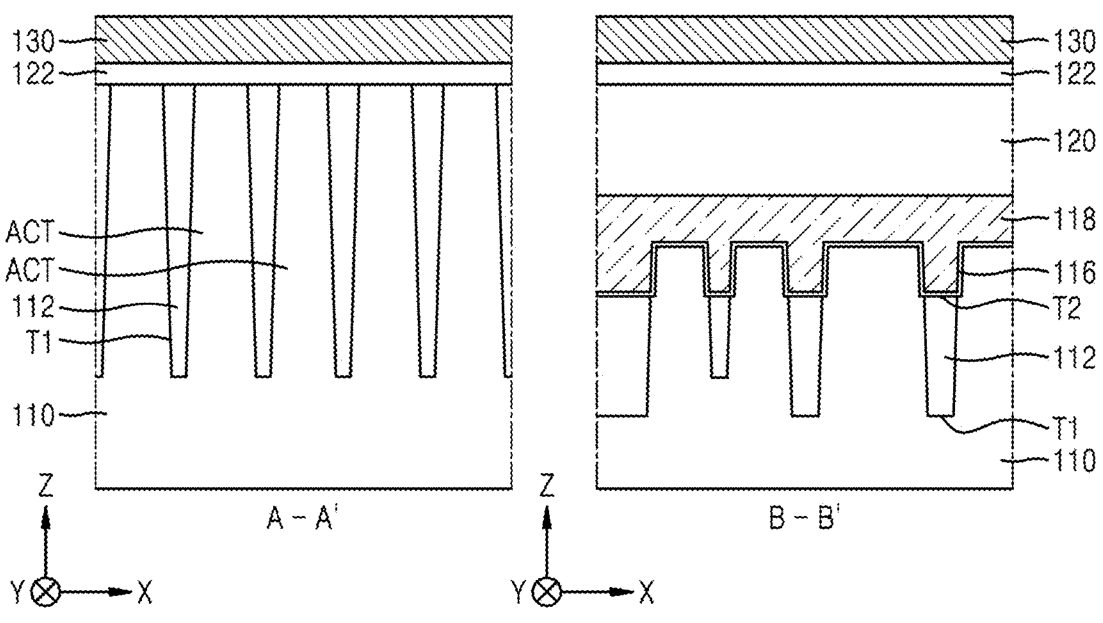
FIGS. 11A to 11J and 12A to 12K are cross-sectional views of a process sequence of a method of manufacturing an IC device, according to embodiments.

Referring to FIG. 11A, a device isolation trench T1 may be formed in the substrate 110, and a device isolation film 112 may be formed in the device isolation trench T1. A plurality of active areas ACT may be defined by the device isolation film 112 in the substrate 110.

A plurality of word line trenches T2 may be formed in the substrate 110. The plurality of word line trenches T2 may extend parallel to each other in a first lateral direction (X direction) and each have a line shape intersecting with the active area ACT. To form the plurality of word line trenches T2, each of which has a bottom surface in which a step is formed, each of the device isolation film 112 and the substrate 110 may be etched by using a separate etching process, and thus, an etched depth of the device isolation film 112 may be different from an etched depth of the substrate 110. After the resultant structure including the plurality of word line trenches T2 is cleaned, a gate dielectric film 116, a word line 118, and a buried insulating film 120 may be sequentially formed inside each of the plurality of word line trenches T2. Before or after the plurality of word lines 118 are formed, an ion implantation process may be performed to form a plurality of source/drain regions in upper portions of the plurality of active areas ACT.

A buffer layer 122 and a lower conductive layer 130 may be sequentially formed on the substrate 110. The buffer layer 122 may be formed to cover top surfaces of the plurality of active areas ACT, a top surface of the device isolation film 112, and top surfaces of the plurality of buried insulating films 120. To form the buffer layer 122, a first silicon oxide film, a silicon nitride film, and a second silicon oxide film may be sequentially formed on the substrate 110, without being limited thereto. The lower conductive layer 130 may include a doped polysilicon film.

Figure 11B:
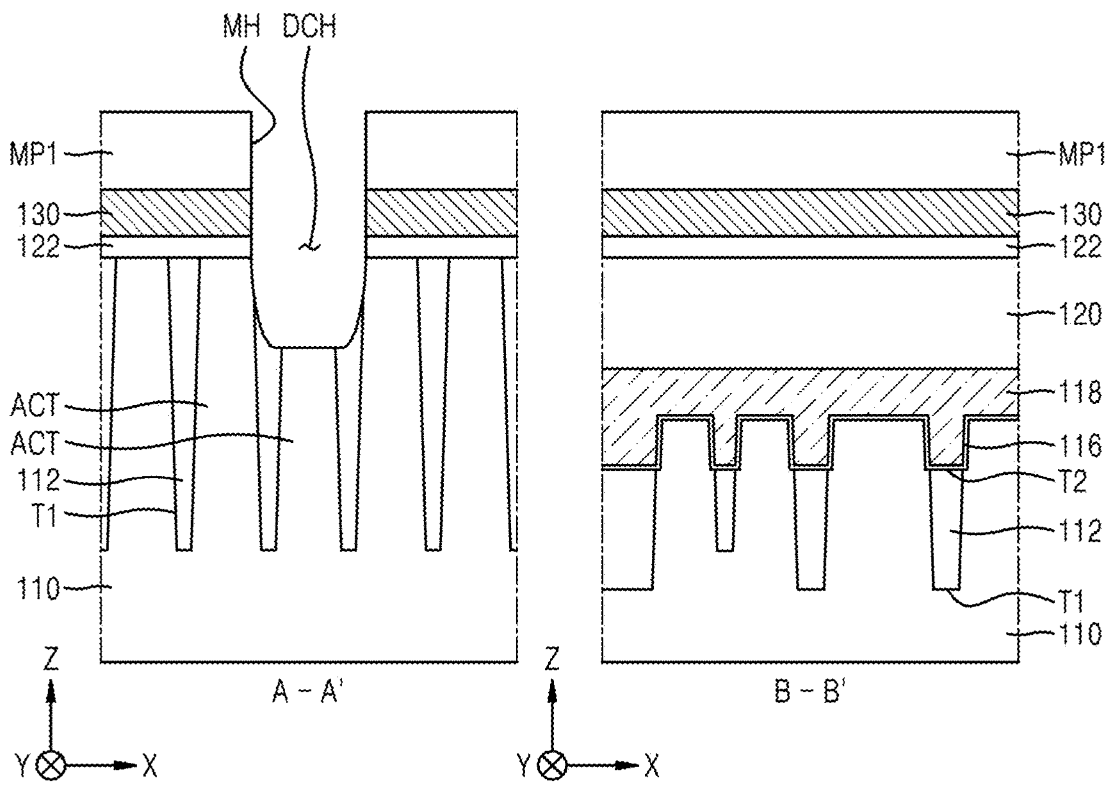

Referring to FIG. 11B, after a mask pattern MP1 is formed on the lower conductive layer 130, a portion of each of the lower conductive layer 130 exposed through an opening MH of the mask pattern MP1, the buffer layer 122 located thereunder, the substrate 110, and the device isolation film 112 may be etched, and thus, a direct contact hole DCH exposing the active area ACT of the substrate 110 may be formed. The mask pattern MP1 may include an oxide film, a nitride film, or a combination thereof, without being limited thereto.

Figure 11C:
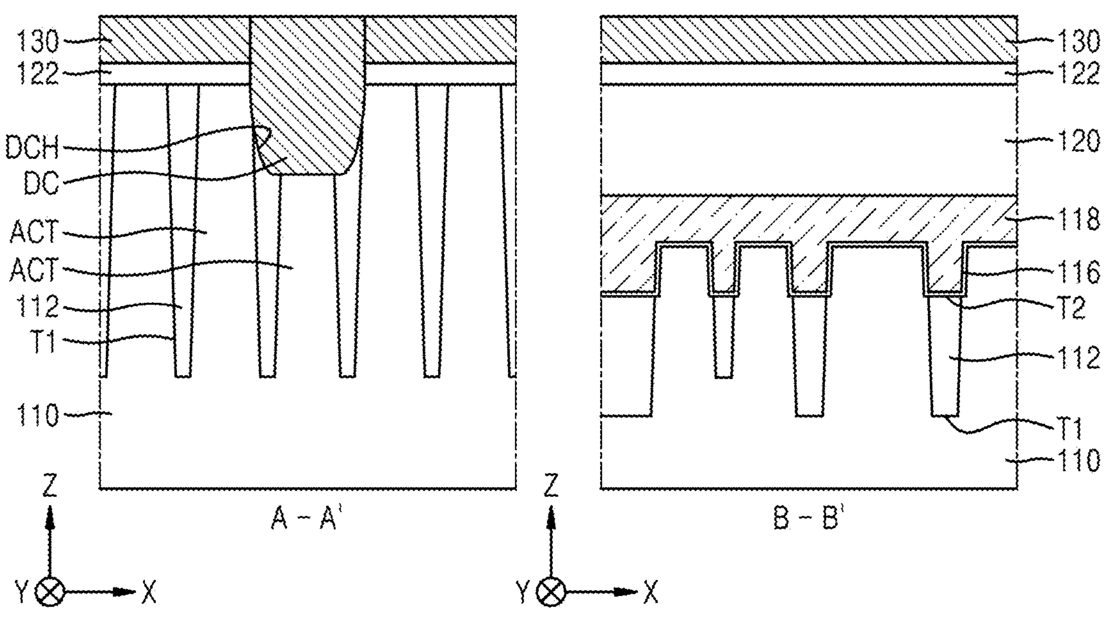

Referring to FIG. 11C, the mask pattern MP1 may be removed from the resultant structure of FIG. 11B, and a direct contact DC may be formed inside the direct contact hole DCH.

In order to the direct contact DC, a doped polysilicon film may be formed to such a sufficient thickness as to fill the direct contact hole DCH. Unnecessary portions of the doped polysilicon film may be removed such that the doped polysilicon film remains only inside the direct contact hole DCH. In embodiments, the direct contact DC may include a polysilicon film doped with an n-type dopant. The n-type dopant may be selected from phosphorus (P), arsenic (As), and antimony (Sb).

Figure 11D:
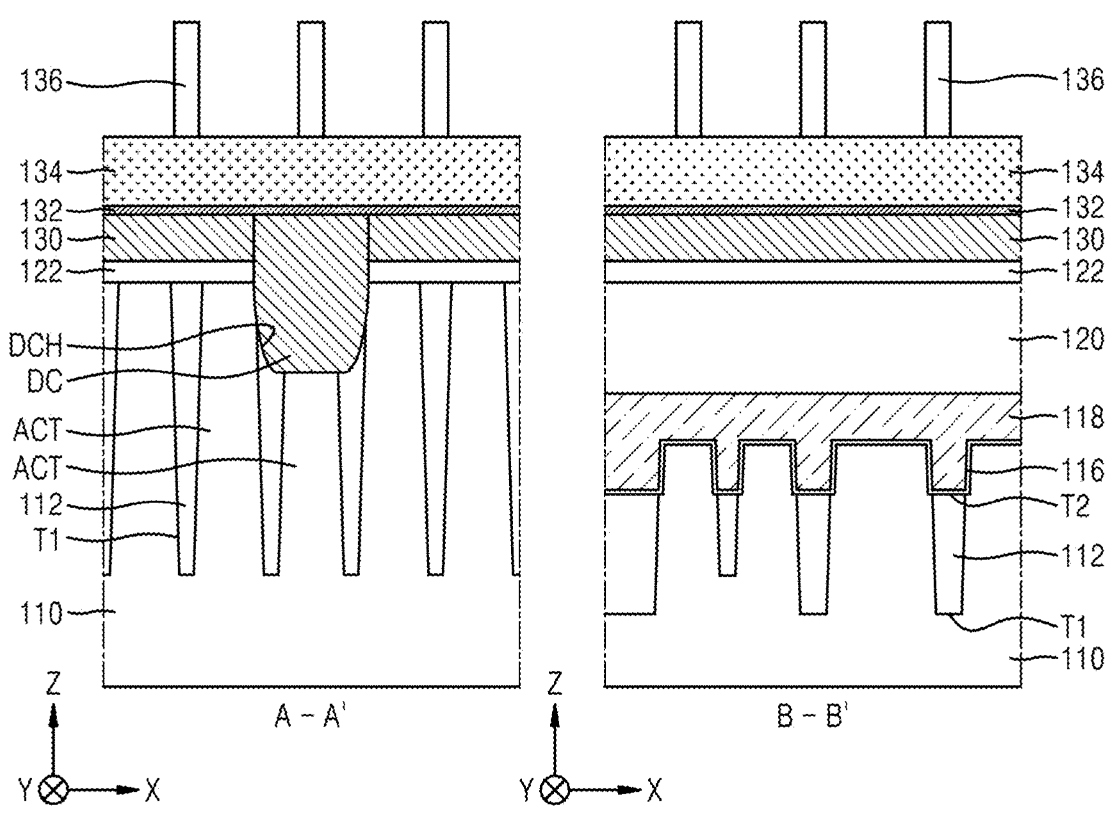

Referring to FIG. 11D, a middle conductive layer 132, an upper conductive layer 134, and a plurality of insulating capping patterns 136 may be sequentially formed on the lower conductive layer 130 and the direct contact DC. Each of the plurality of insulating capping patterns 136 may include a line pattern extending long in a second lateral direction (Y direction).

Figure 11E:
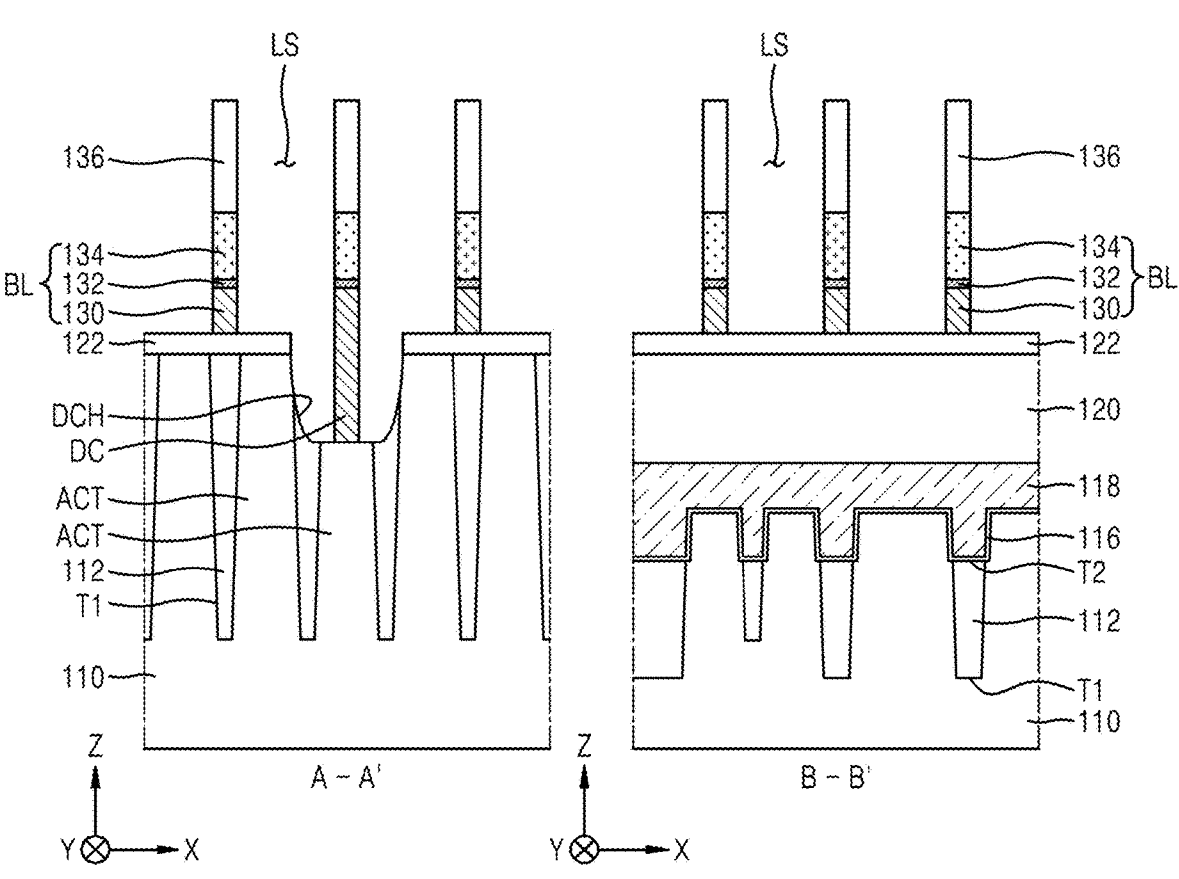

Referring to FIG. 11E, in the resultant structure of FIG. 11D, a portion of each of the upper conductive layer 134, the middle conductive layer 132, the lower conductive layer 130, and the direct contact DC may be etched by using the insulating capping pattern 136 as an etch mask, and thus, a plurality of bit lines BL may be formed on the substrate 110. The plurality of bit lines BL may include the respective remaining portions of the lower conductive layer 130, the middle conductive layer 132, and the upper conductive layer 134.

After the plurality of bit lines BL are formed, a portion of the direct contact hole DCH may be exposed again around the direct contact DC, and a line space LS extending long in the second lateral direction (Y direction) may be defined between every two adjacent ones of the plurality of bit lines BL.

Figure 11F:
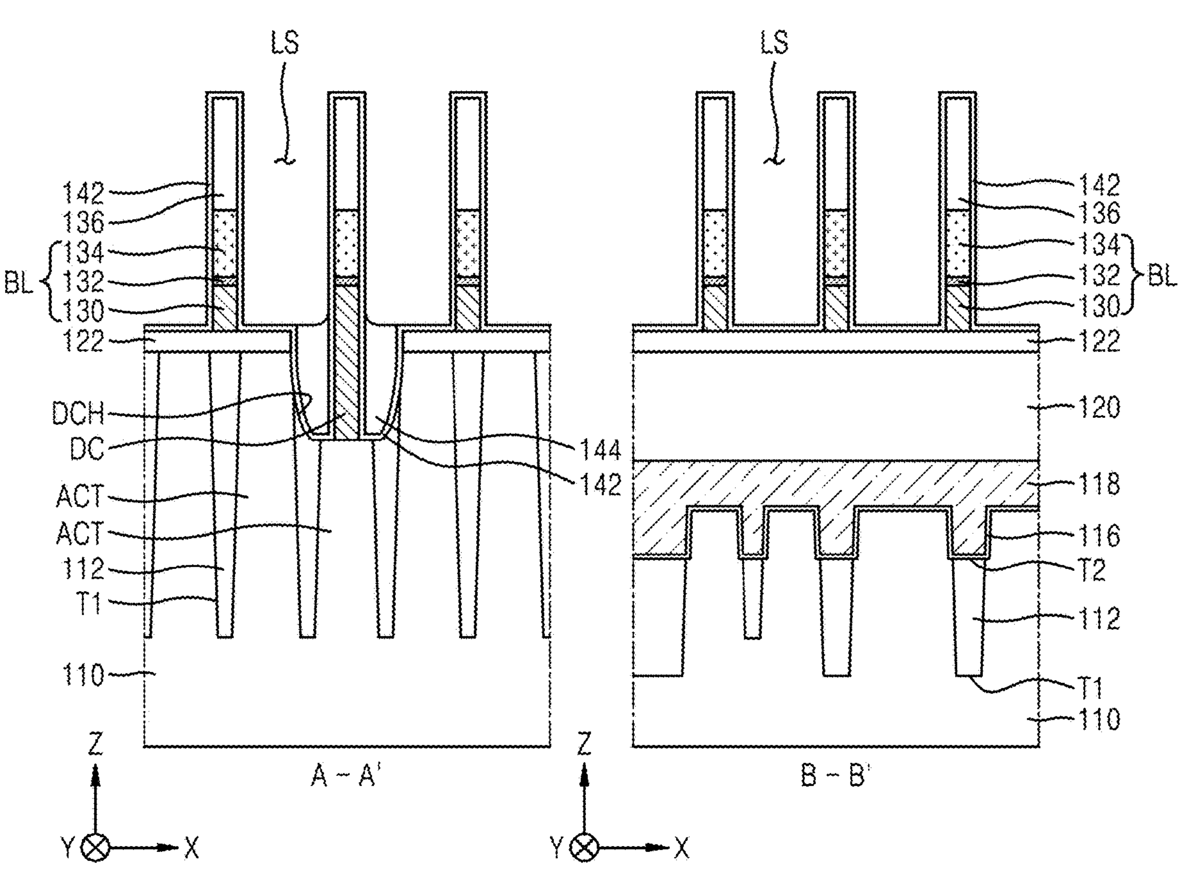

Referring to FIG. 11F, inner insulating spacers 142 may be formed to conformally cover the exposed surfaces of the resultant structure of FIG. 11E, and a gap-fill insulating pattern 144 may be formed on the inner insulating spacers 142 to fill the remaining space of the direct contact hole DCH.

The inner insulating spacers 142 may be formed to conformally cover each of the direct contact DC, the lower conductive layer 130, the middle conductive layer 132, the upper conductive layer 134, and the plurality of insulating capping patterns 136. The inner insulating spacers 142 may include a silicon nitride film. The inner insulating spacers 142 may be formed by using a chemical vapor deposition (CVD) or an atomic layer deposition (ALD) process.

To form the gap-fill insulating pattern 144, a gap-fill insulating film may be formed on the inner insulating spacers 142 by using a CVD process or an ALD process to fill the remaining space of the direct contact hole DCH and cover a sidewall of each of the plurality of bit lines BL, the plurality of insulating capping patterns 136, and a plurality of direct contacts DC. Thereafter, the gap-fill insulating film may be isotropically etched to form the gate-fill insulating pattern 144, which includes the remaining portion of the gap-fill insulating film. The gap-fill insulating pattern 144 may include a portion, which fills the inside of the direct contact hole DCH, and a portion, which covers the entrance of the direct contact hole DCH outside a side of the entrance of the direct contact hole DCH.

Figure 11G:
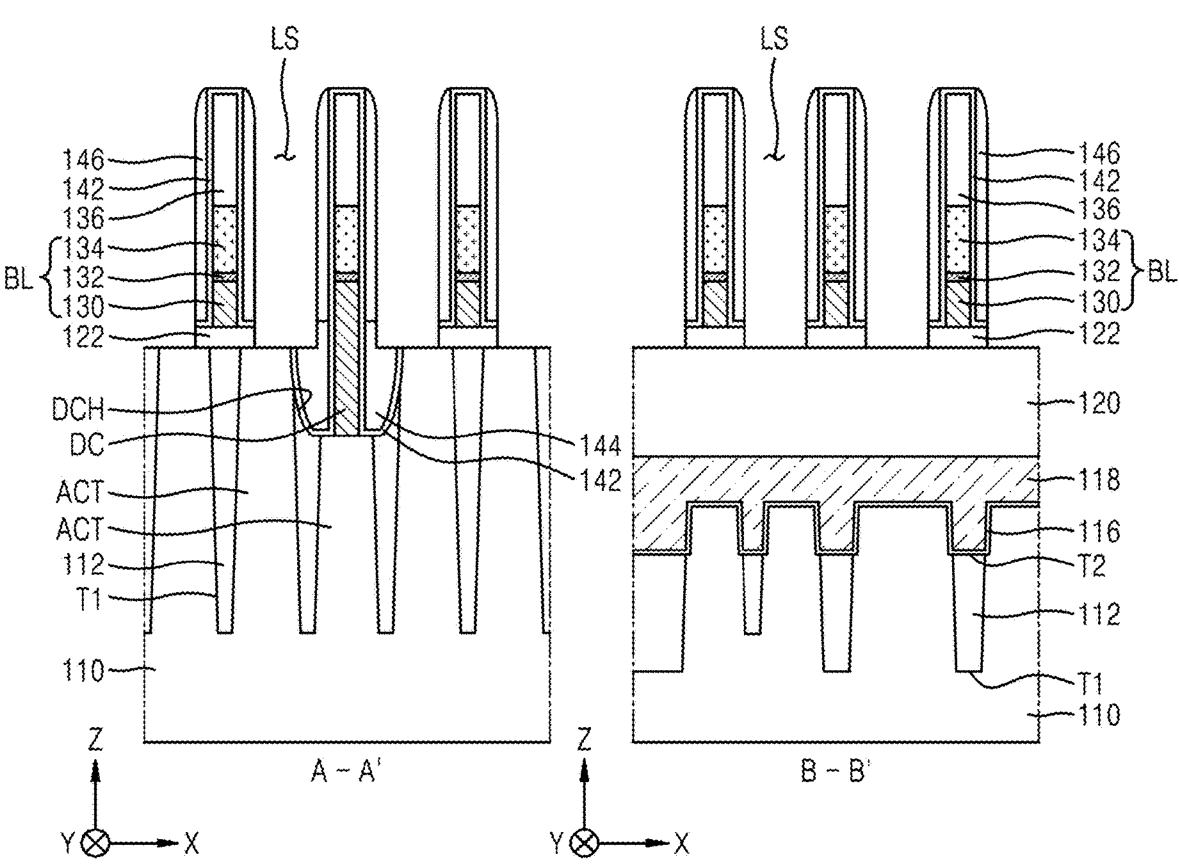

Referring to FIG. 11G, a middle insulating spacer film may be formed by using a CVD process or an ALD process to conformally cover the exposed surfaces of the resultant structure of FIG. 11F. Thereafter, the middle insulating spacer film may be anisotropically etched to form a plurality of middle insulating spacers 146 from the middle insulating spacer film.

During the anisotropic etching of the middle insulating spacer film to form the plurality of middle insulating spacers 146, a portion of the inner insulating spacers 142 and a portion of the buffer layer 122 may be removed. As a result, a portion of the substrate 110, portions of the inner insulating spacers 142, and a portion of the gap-fill insulating pattern 144 may be exposed through a plurality of line spaces LS. Each of the plurality of middle insulating spacers 146 may cover a sidewall of the bit line BL and a sidewall of the insulating capping pattern 136 on the inner insulating spacers 142. In embodiments, the plurality of middle insulating spacers 146 may include a silicon oxide film.

Figure 11H:
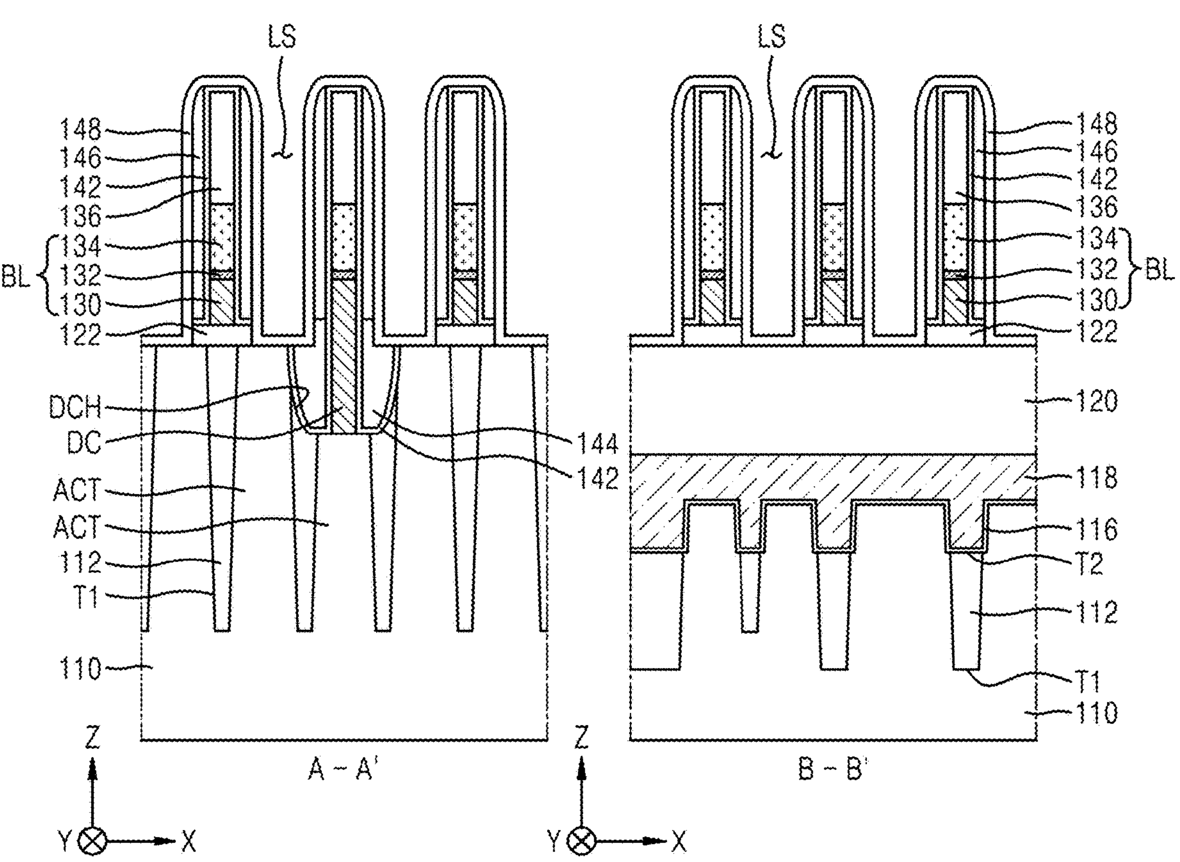

Referring to FIG. 11H, outer insulating spacers 148 may be formed to conformally cover the resultant structure of FIG. 11G. The outer insulating spacers 148 may be formed by using a CVD process or an ALD process.

Figure 11I:
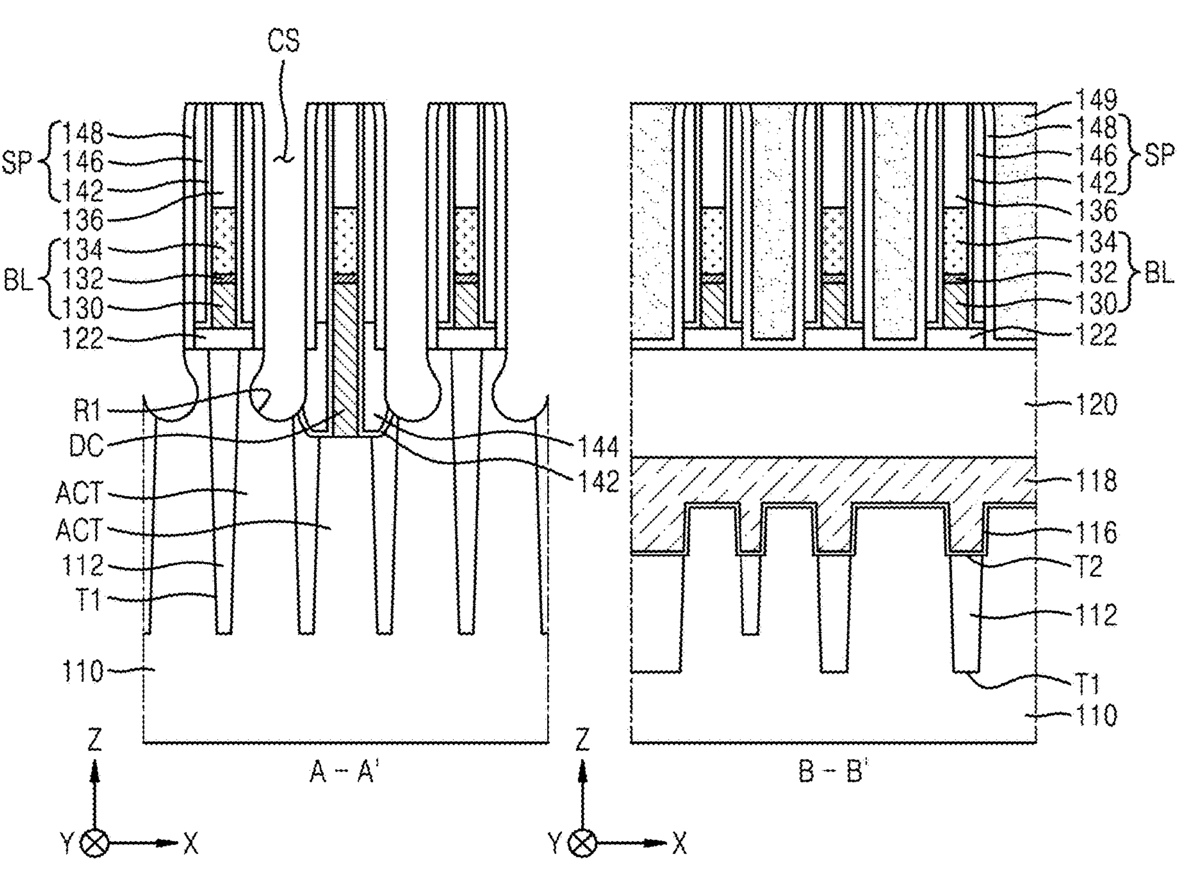

Referring to FIG. 11I, in the resultant structure of FIG. 11H, a plurality of insulating fences 149 may be formed apart from each other in the line space LS, which is defined by the outer insulating spacers 148 between every two adjacent ones of the plurality of bit lines BL. Thus, the line space LS may be separated into a plurality of contact spaces CS.

Each of the plurality of insulating fences 149 may overlap the word line 118 on the word line 118 in the vertical direction (Z direction). The plurality of insulating fences 149 may include a silicon nitride film. In embodiments, during the formation of the plurality of insulating fences 149, respective portions of the plurality of insulating capping patterns 136 and insulating films located adjacent thereto may be consumed and heights thereof may be reduced.

Thereafter, portions of structures exposed through the plurality of contact spaces CS may be removed, and thus, a plurality of recess spaces R1 exposing the plurality of active areas ACT of the substrate 110 may be respectively formed between the plurality of bit lines BL. The plurality of recess spaces R1 may be formed by using an anisotropic etching process or a combination of the anisotropic etching process and an isotropic etching process. For example, between every two adjacent ones of the plurality of bit lines BL, the outer insulating spacers 148 exposed at bottoms of the plurality of contact spaces CS and portions of the substrate 110 located thereunder may be anisotropically etched. As a result, exposed portions of the active region ACT of the substrate 110 may be isotropically etched to form the plurality of recess spaces R1. Each of the plurality of recess spaces R1 may be connected to the contact space CS. During the etching process for forming the plurality of recess spaces R1, a portion of each of the inner insulating spacers 142 and the gap-fill insulating pattern 144 may be consumed in an area adjacent to a top surface of the substrate 110.

A portion of the active area ACT of the substrate 110, portions of the inner insulating spacers 142, and a portion of the gap-fill insulating pattern 144 may be exposed through the plurality of recess spaces R1. After the plurality of recess spaces R1 are formed, the inner insulating spacers 142, the middle insulating spacers 146, and the outer insulating spacers 148, which remain on both sidewalls of the bit line BL, may constitute a spacer structure SP.

Figure 11J:
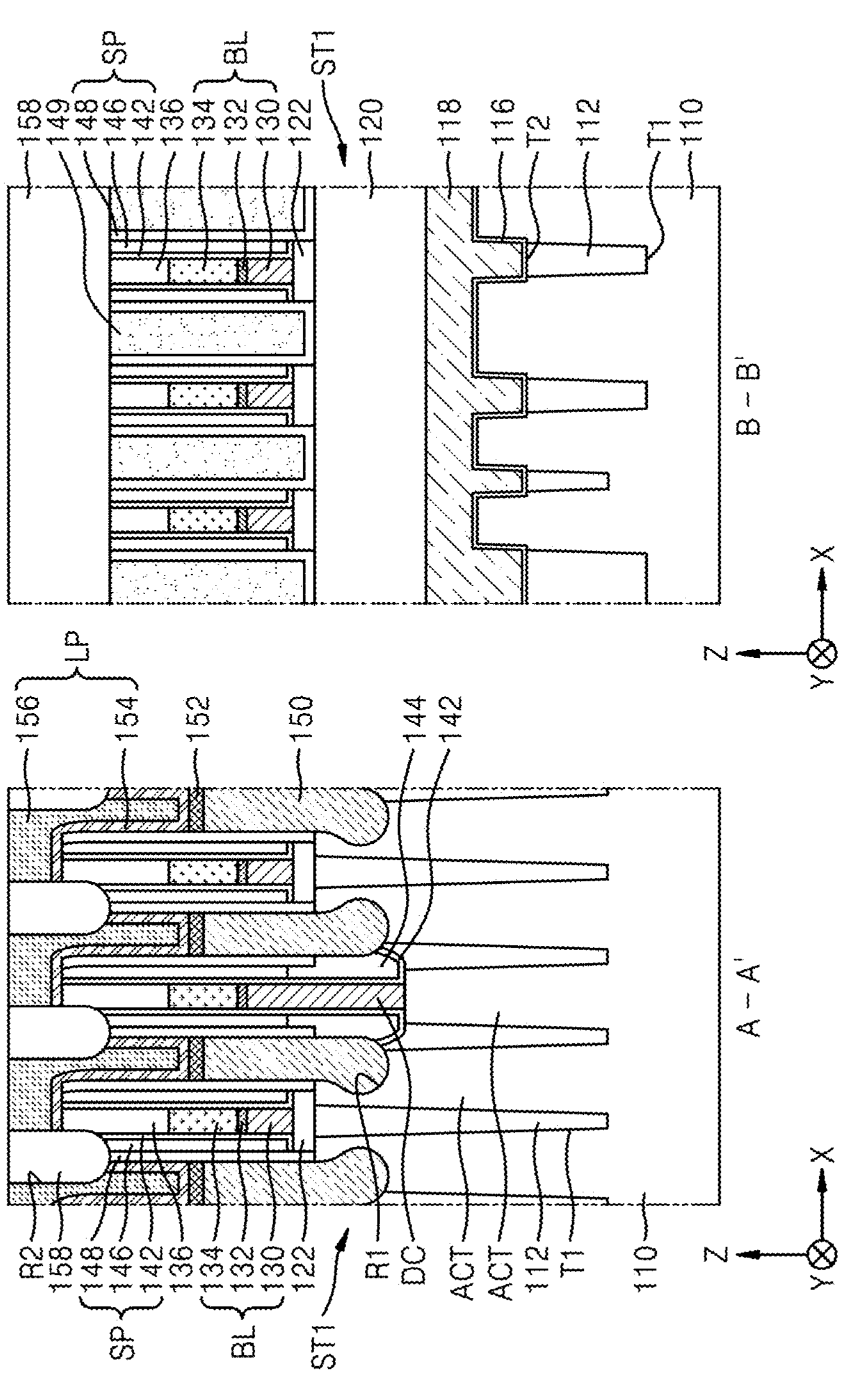

Referring to FIG. 11J, in the resultant structure of FIG. 11I, a plurality of contact plugs 150 may be respectively formed to fill portions of the plurality of recess spaces R1 and the plurality of contact spaces (refer to CS in FIG. 11I between the plurality of bit lines BL. A plurality of metal silicide films 152 may be formed on the plurality of contact plugs 150. In the resultant structure including the metal silicide films 152, a conductive barrier film 154 and a metal film 156 may be sequentially formed to fill the respective remaining spaces of the plurality of contact spaces CS and cover the insulating capping pattern 136 and the spacer structure SP.

Thereafter, a recess space R2 may be formed by removing a portion of each of the conductive barrier film 154, the metal film 156, the insulating capping pattern 136, and the spacer structure SP. As a result, a plurality of conductive landing pads LP, which include the remaining portions of the conductive barrier film 154 and the metal film 156, may be obtained.

In embodiments, after the plurality of conductive landing pads LP are formed, the method further include replacing, by air spacers, at least a portion of the silicon oxide film that forms the plurality of middle insulating spacers 146, each of which is exposed through the recess space R2.

Thereafter, an insulating pattern 158 filling the recess space R2 may be formed around each of the plurality of conductive landing pads LP, and thus, a lower structure ST1 may be formed on the substrate 110. The plurality of insulating capping patterns 136, the plurality of spacer structures SP, the plurality of insulating fences 149, and the insulating pattern 158, which are shown in FIG. 11J, may constitute the plurality of insulating structures 129 shown in FIGS. 4A and 4B. The plurality of contact plugs 150, the plurality of metal silicide films 152, and the plurality of conductive landing pads LP, which are shown in FIG. 11J, may constitute the plurality of conductive areas LP1 shown in FIGS. 4A and 4B.

Figure 12A:
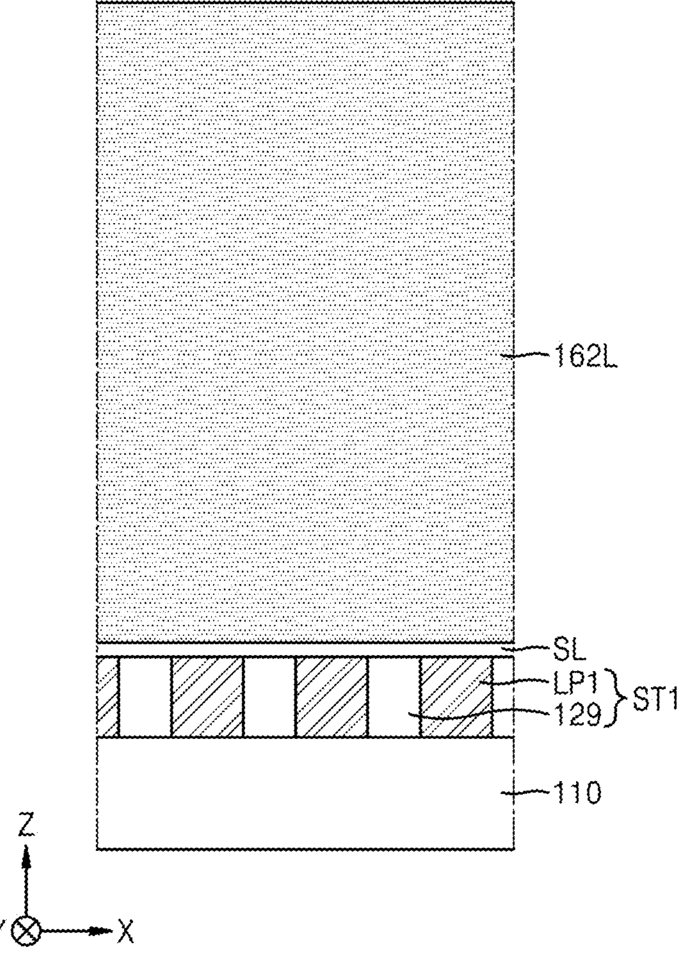

Next, an example method of manufacturing an IC device 100 including a plurality of capacitors CP1 on a lower structure ST1 will be described with reference to FIGS. 12A 12K. In FIGS. 12A to 12K, the same reference numerals are used to denote the same elements as in FIGS. 4A to 4C, and detailed descriptions thereof are omitted here.

Referring to FIG. 12A, by using the same method as described with reference to FIGS. 11A to 11J, the lower structure ST1 including a plurality of insulating structures 129 and a plurality of conductive areas LP1 may be formed on a substrate 110.

Thereafter, a bottom insulating film SL may be formed on the lower structure ST1, and a SiGe preliminary film 162L may be formed on the bottom insulating film SL.

The bottom insulating film SL may be used as an etch stop film when the SiGe preliminary film 162L is etched to form a plurality of holes (refer to 162H in FIG. 12*b*) in a subsequent process. The bottom insulating film SL may include a silicon nitride (SiN) film, a silicon carbonitride (SiCN) film, a silicon boron nitride (SiBN) film, or a combination thereof.

The SiGe preliminary film 162L may include a component of which a constant varies according to a distance from the substrate 110. In embodiments, the SiGe preliminary film 162L may have a Ge content that gradually reduces toward the substrate 110. For example, the SiGe preliminary film 162L may include a doped SiGe film, and a Ge content of the doped SiGe film may be gradually reduced toward the substrate 110.

The doped SiGe film may include a SiGe film doped with a boron (B) atom, without being limited thereto. In other embodiments, the SiGe preliminary film 162L may include at least one dopant selected from a fluorine (F) atom and a hydrogen (H) atom, and a content of the at least one dopant of the SiGe preliminary film 162L may gradually increase toward the substrate 110. In this case, a Ge content of the SiGe preliminary film 162L may be constant entirely over the SiGe film 162 or gradually reduce toward the substrate 110. The SiGe preliminary film 162L may further include a boron (B) atom in addition to a fluorine (F) atom and a hydrogen (H) atom. In this case, a content of boron (B) atoms in the SiGe preliminary film 162L may be constant entirely over the SiGe preliminary film 162L. A constituent material of the SiGe preliminary film 162L may be the same as a constituent material of the SiGe film 162 described with reference to FIGS. 4A and 4B.

Figure 12B:
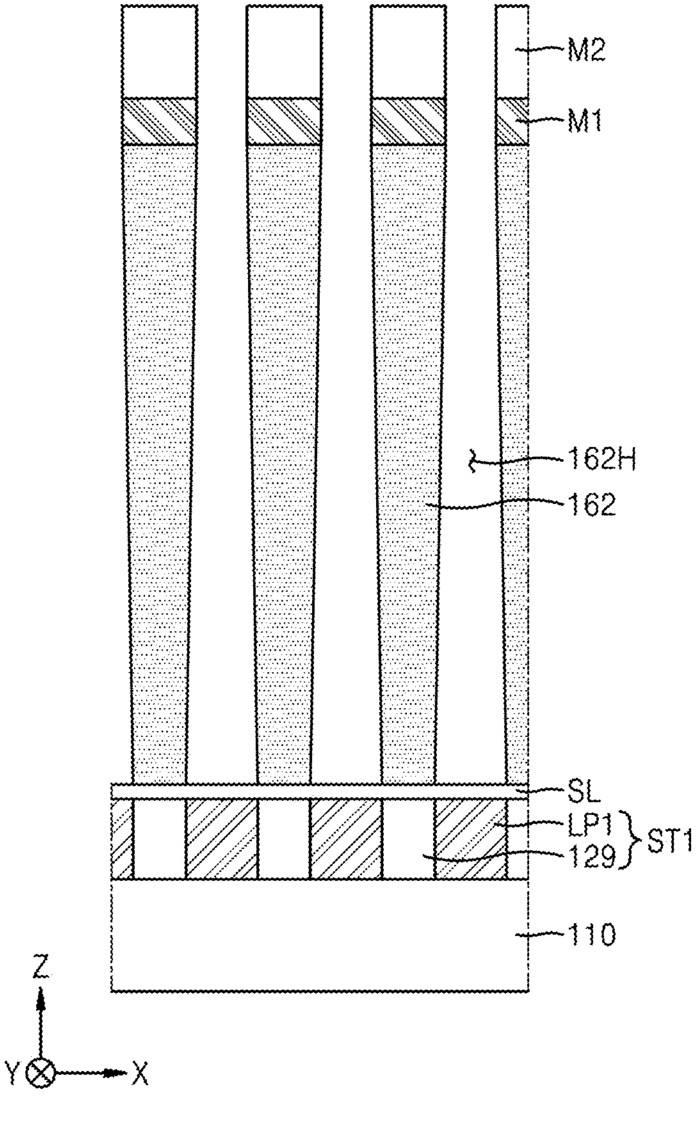

Referring to FIG. 12B, in the resultant structure of FIG. 12A, a polishing stop film M1 and a mask pattern M2 may be sequentially formed on the SiGe preliminary film 162L, and the polishing stop film M1 and the SiGe preliminary film 162L may be etched by using the mask pattern M2 as an etch mask and using the bottom insulating film SL as an etch stop film. Thus, the SiGe film 162 including the plurality of holes 162H may be formed. The bottom insulating film SL may be exposed through the plurality of holes 162H formed in the SiGe film 162.

To etch the SiGe preliminary film 162L, a dry etching process using an etch gas including a fluorine compound, a chlorine compound, a bromine compound, or a combination thereof and a wet cleaning process using a cleaning solution may be sequentially performed. The fluorine compound may include $CF_4$, $C_4F_8$, $C_4F_6$, $CH_2F_2$, $CHF_3$, $SF_6$, $NF_3$, or a combination thereof, without being limited thereto. The chlorine compound may include HCl, $Cl_2$, $SiCl_4$, $SiHCl_3$, $SiH_2Cl_2$, $GeCl_4$, $GeHCl_3$, or a combination thereof, without being limited thereto. The bromine compound may include HBr, $Br_2$, or a combination thereof, without being limited thereto. The cleaning solution may include hydrofluoric acid (HF), ammonium fluoride ($NH_4F$), or a combination thereof, without being limited thereto.

As described above, because the SiGe preliminary film 162L includes the component of which the content varies according to the distance from the substrate 110, an etched amount of the SiGe preliminary film 162L may increase toward the substrate 110 during the formation of the plurality of holes 162H by etching the SiGe preliminary film 162L. As a result, a width of each of the plurality of holes 162H formed in the SiGe film 162 in a lateral direction may gradually increase toward the substrate 110. Accordingly, a partial region of the SiGe film 162 (e.g., a partial region of the SiGe film 162 between two adjacent ones of a plurality of first electrodes 168) may have a width that gradually reduces toward the substrate 110 in the lateral direction.

In embodiments, the process of etching the SiGe preliminary film 162L may include sequentially performing the dry etching process and the wet cleaning process. In the dry etching process, a plurality of preliminary holes, of which a width in a lateral direction is constant or gradually reduces toward the substrate 110, may be formed. Thereafter, in view of the fact that the SiGe preliminary film 162L includes the component of which the content varies according to the distance from the substrate 110, the wet etching process may be performed by using a cleaning solution capable of providing an atmosphere in which a consumption of the SiGe preliminary film 162L increases toward the substrate 110. Thus, portions of the SiGe preliminary film 162L, which are exposed inside the plurality of preliminary holes, may be removed. As a result, the plurality of holes 162H of which a width in the lateral direction gradually increases toward the substrate 110 may be formed as shown in FIG. 12B.

In other embodiments, the process of etching the SiGe preliminary film 162L may include sequentially performing the dry etching process and the wet cleaning process. In view of the fact that the SiGe preliminary film 162L includes the component of which the content varies according to the distance from the substrate 110, the dry etching process may be performed by using an etch gas capable of providing an atmosphere in which a consumption of the SiGe preliminary film 162L increases toward the substrate 110. Thus, the plurality of holes 162H of which a width in a lateral direction gradually increases toward the substrate 110 may be formed as shown in FIG. 12B. Thereafter, the wet etching process may be performed to remove etching byproducts remaining inside the plurality of holes 162H.

Figure 12C:
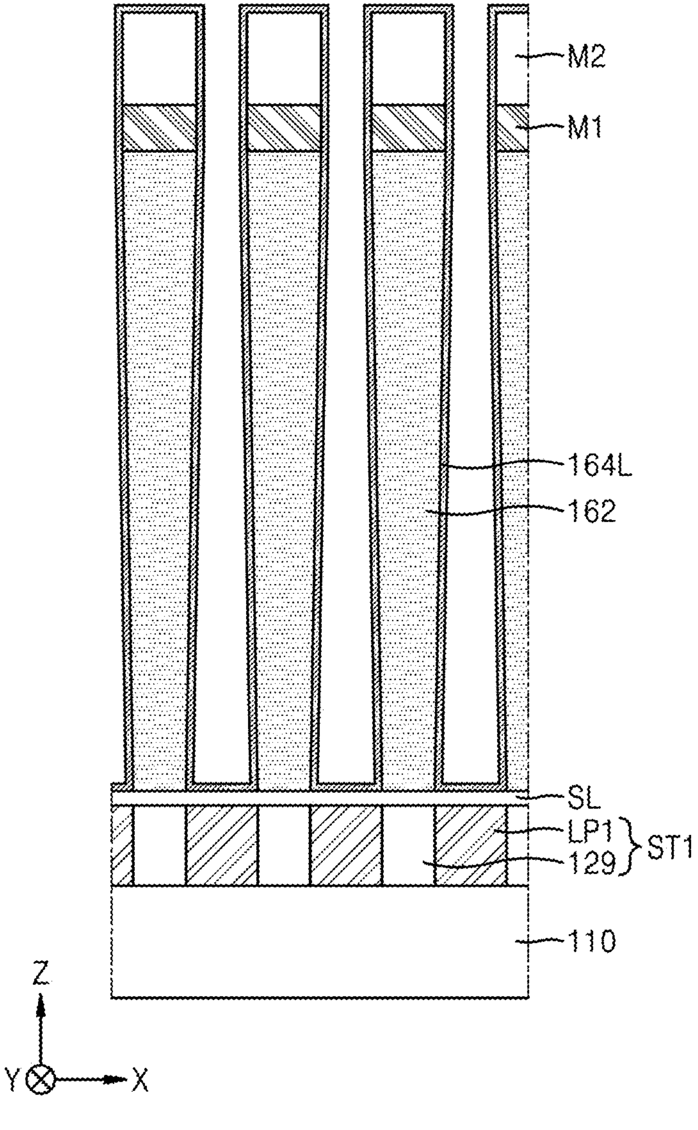

Referring to FIG. 12C, a conductive metal-containing film 164L may be formed to conformally cover the exposed surfaces of the resultant structure of FIG. 12B in which the plurality of holes 162H are formed. A constituent material of the conductive metal-containing film 164L may be the same as a constituent material of the conductive metal-containing pattern 164 described with reference to FIGS. 4A and 4B.

Figure 12D:
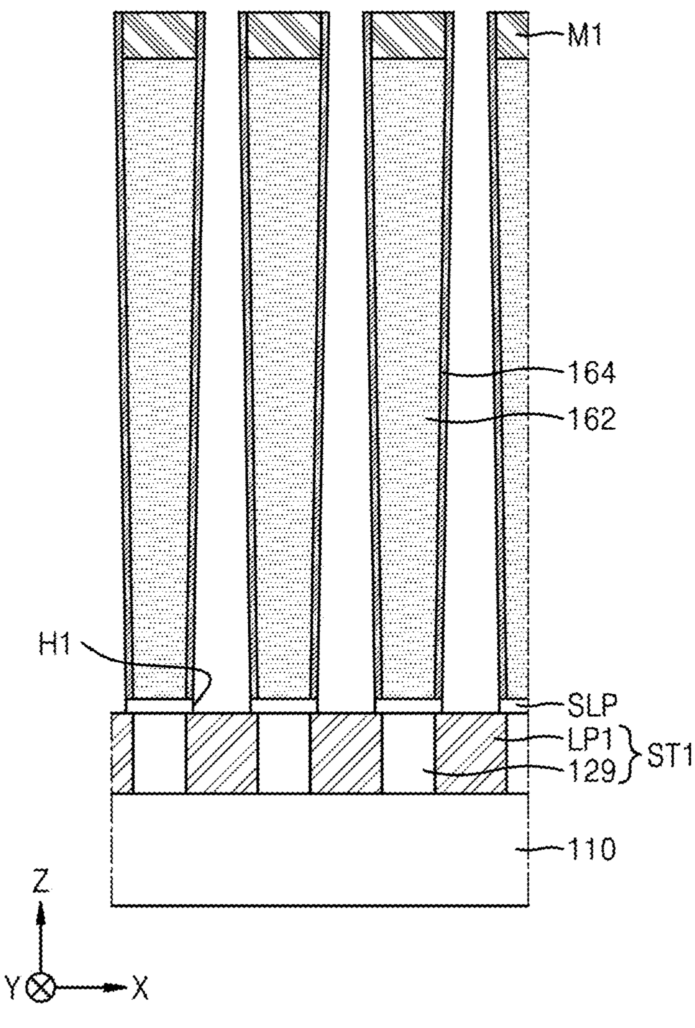

Referring to FIG. 12D, in the resultant structure of FIG. 12C, the conductive metal-containing film 164L may be etched back to form a plurality of conductive metal-containing patterns 164. The bottom insulating film SL may be etched through the plurality of holes 162H to form a bottom insulating pattern SLP having a plurality of openings H1. The mask pattern M2 may be removed to expose a top surface of the polishing stop film M1. The plurality of conductive areas LP1 may be exposed through the plurality of openings H1.

Figure 12E:
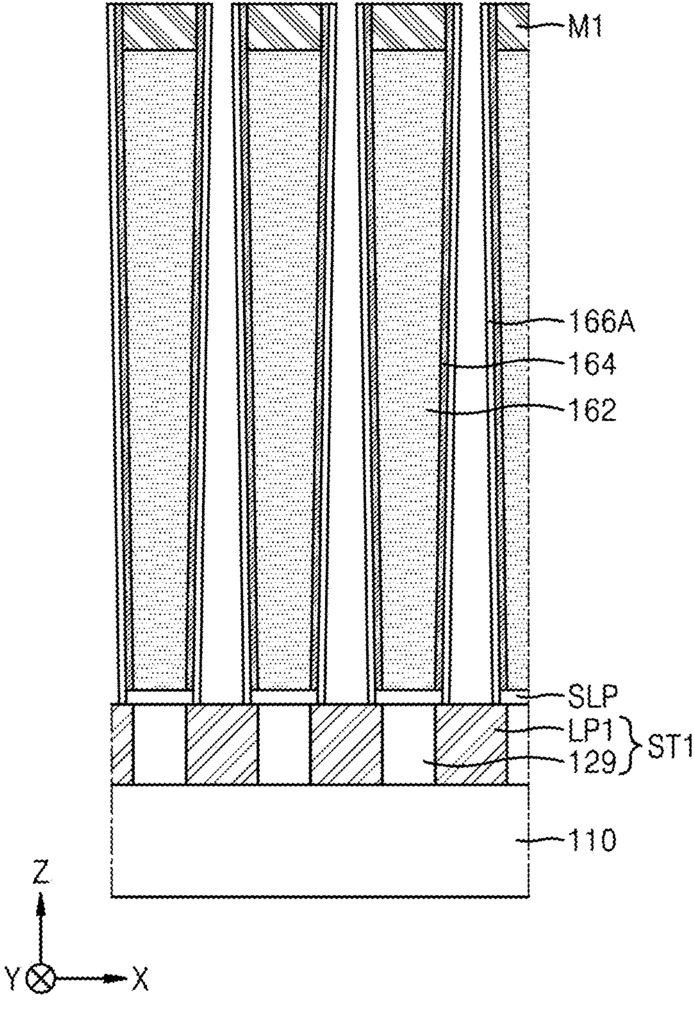

Referring to FIG. 12E, in the resultant structure of FIG. 12D, a plurality of first dielectric films 166A may be respectively formed one-by-one inside the plurality of holes 162H.

In embodiments, to form the plurality of first dielectric films 166A, a preliminary first dielectric film may be formed to conformally cover the exposed surfaces of the resultant structure of FIG. 12D. Thereafter, the preliminary first dielectric film may be etched back to expose the plurality of conductive areas LP1 through the plurality of openings H1.

In other embodiments, the process described with reference to FIG. 12D may be omitted, and the preliminary first dielectric film may be formed on the conductive metal-containing film 164L as described with reference to FIG. 12E directly after the process described with reference to FIG. 12C is performed. Afterwards, the preliminary first dielectric film and the conductive metal-containing film 164L may be sequentially etched to form the plurality of first dielectric films 166A, and the plurality of conductive areas LP1 may be exposed through the plurality of openings H1.

Figure 12F:
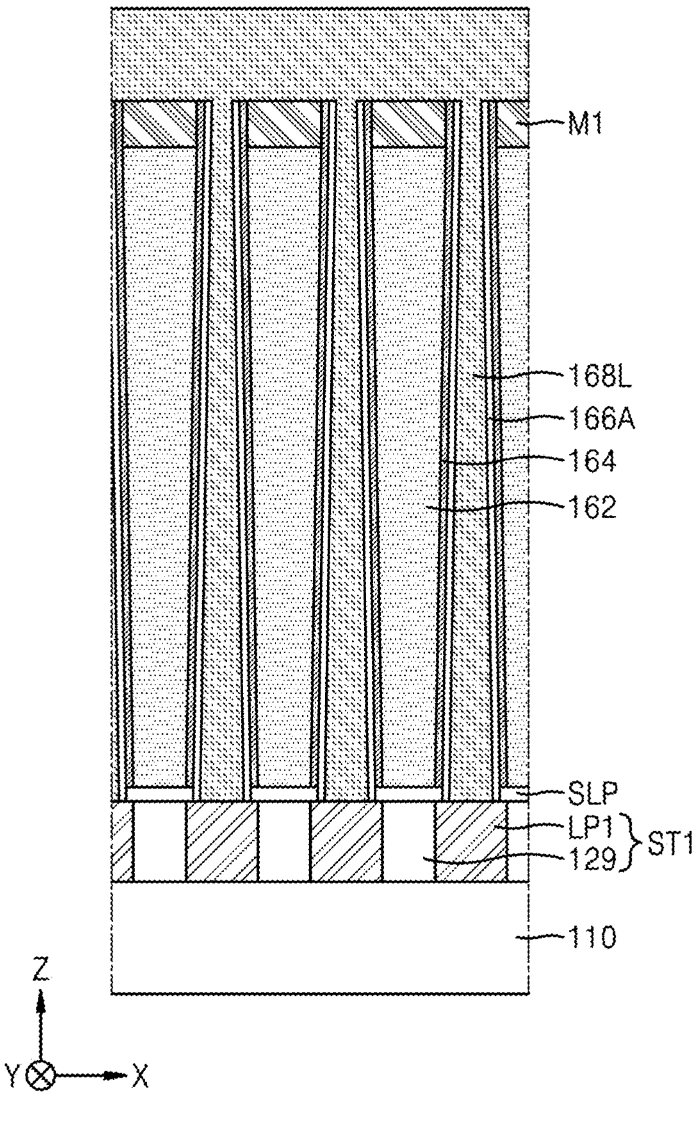

Referring to FIG. 12F, a first electrode layer 168L may be formed to fill the plurality of openings H1 and the plurality of holes (refer to 162H in FIG. 12B) and cover the top surface of the polishing stop film M1. A constituent material of the first electrode layer 168L may be the same as a constituent material of the plurality of first electrodes 168 described with reference to FIGS. 4A and 4B.

Figure 12G:
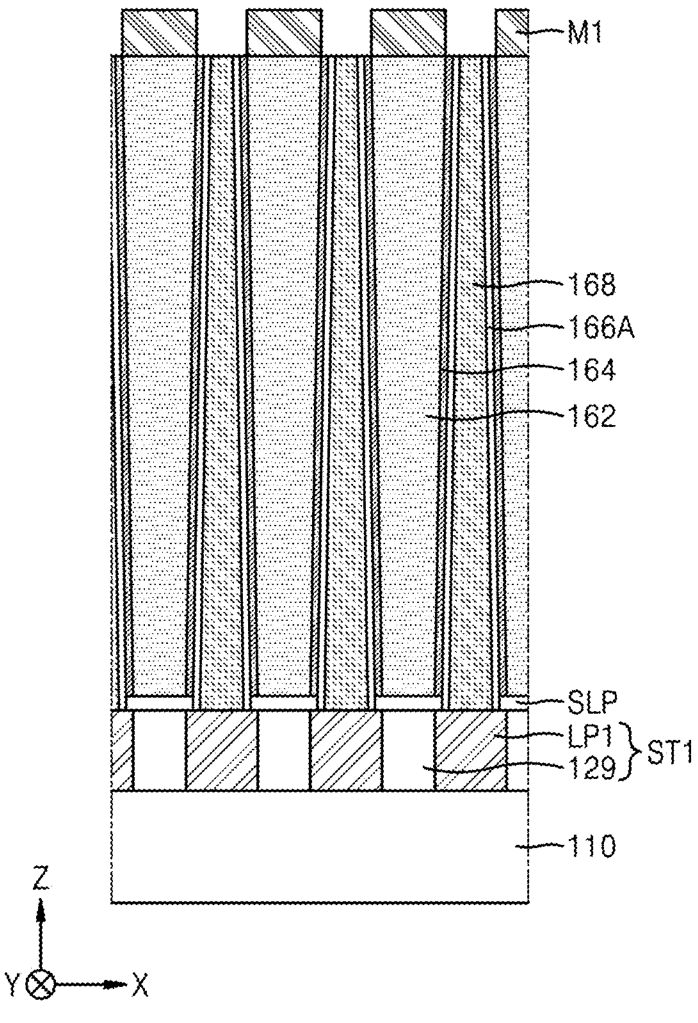

Referring to FIG. 12G, the first electrode layer 168L may be etched back in the resultant structure of FIG. 12F. Thus, the plurality of first electrodes 168 filling the plurality of openings H1 and the plurality of holes 162H may be formed from the first electrode layer 160L. Uppermost surfaces of the plurality of first electrodes 168 may be at a lower vertical level than an uppermost surface of the polishing stop film M1.

Figure 12H:
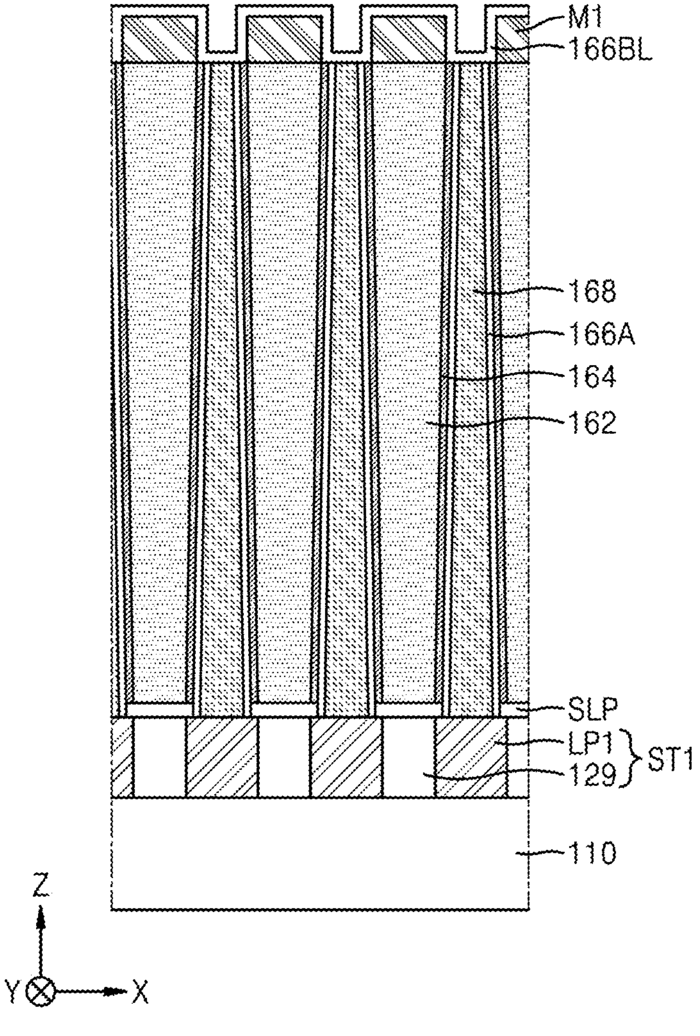

Referring to FIG. 12H, in the resultant structure of FIG. 12G, a preliminary second dielectric film 166BL may be formed to cover the respective exposed surfaces of the plurality of first electrodes 168, the plurality of first dielectric films 166A, the plurality of conductive metal-containing patterns 164, and a plurality of polishing stop films M1. A constituent material of the preliminary second dielectric film 166BL may be the same as the same as a constituent material of the plurality of second dielectric films 166B described with reference to FIGS. 4A and 4B.

Figure 12I:
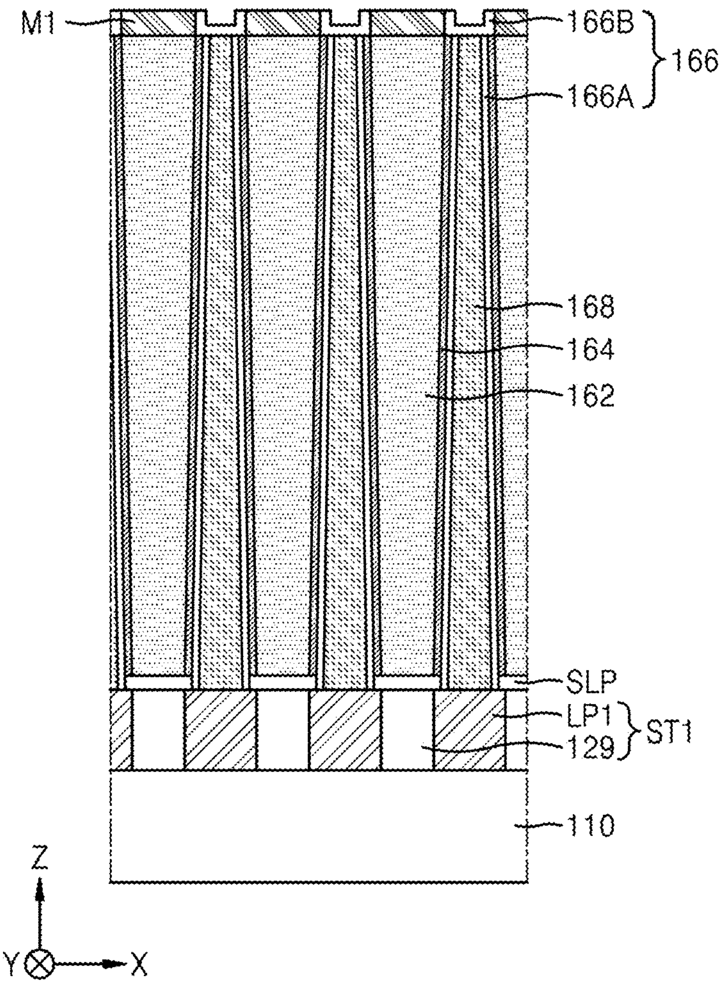

Referring to FIG. 12I, a portion of the preliminary second dielectric film 166BL and a portion of the polishing stop film M1 may be polished from an upper portion of the resultant structure of FIG. 12H by using the polishing stop film M1 as a polishing stopper. As a result, a height of the polishing stop film M1 may be reduced, and the plurality of second dielectric films 166B may be obtained from the preliminary second dielectric film 166BL.

Figure 12J:
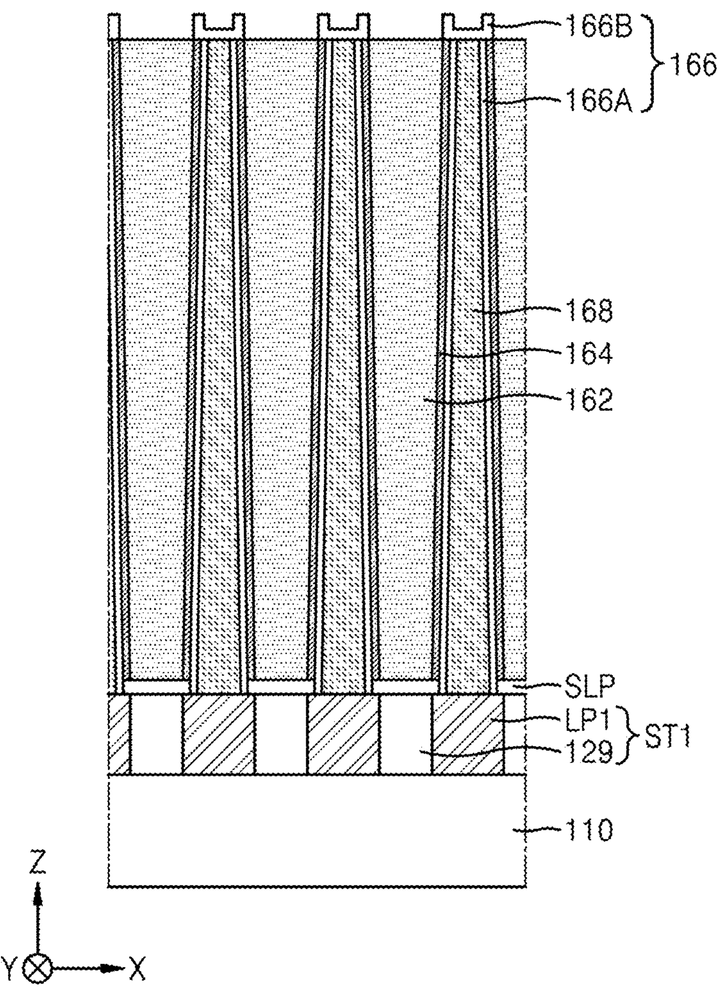
Figure 12K:
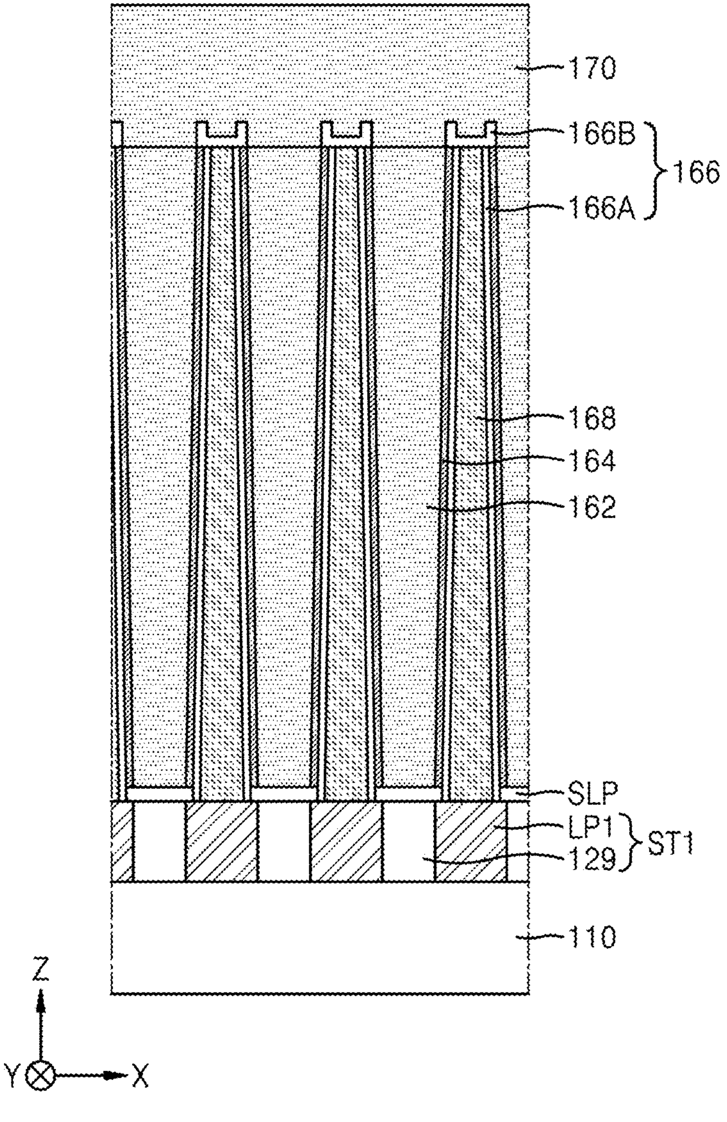

Referring to FIG. 12J, the polishing stop film M1 may be removed from the resultant structure of FIG. 12I to expose a top surface of the SiGe film 162.

Referring to FIG. 12K, on the resultant structure of FIG. 12J, an outer SiGe film 170 may be formed to cover the SiGe film 162 and the plurality of second dielectric films 166B.

Subsequently, as shown in FIG. 4A, a capping insulating film 178, a conductive contact plug 180, an upper wiring layer 186, and an interlayer insulating film 188 may be formed on the outer SiGe film 170, and thus, the IC device 100 shown in FIGS. 4A to 4C may be manufactured.

According to the method of manufacturing the IC device 100 described with reference to FIGS. 11A to 11J and 12A to 12K, forming an additional mold film may not be required to form the plurality of first electrodes 168, and the plurality of first electrodes 168 may be formed by using the SiGe film 162 included in the second electrode PE as a mold film. Thus, because a lift-off process using an etchant may be omitted to remove the mold film, the process may be simplified, and problems, such as undesired deformation of the first electrodes 168, which may occur during the lift-off process using the etchant, may be limited and/or prevented.

The method of manufacturing the IC device 100 described with reference to FIGS. 11A to 11J and FIGS. 12A to 12K may not include a process of forming an additional support film configured to support the plurality of first electrodes 168. Accordingly, in the IC device 100, an increase in the planar areas of the plurality of capacitors CP1 due to the support film and the resultant increase in the planar area of the outer SiGe film 170 may be limited and/or suppressed, effective areas of the plurality of capacitors CP1 may be increased, and the number of effective cells arranged in a memory cell area (refer to 22 in FIG. 1) may be increased. Therefore, the integration density of the IC device 100 may be improved.

In addition, when the IC device 100 is manufactured, because the plurality of first electrodes 168 are formed by using the SiGe film 162 included in the second electrode PE as a mold, the leaning of at least some of the plurality of first electrodes 168 may be limited and/or prevented during the process of manufacturing the IC device 100. As a result, a failure due to a short circuit between adjacent ones of the plurality of first electrodes 168 may be limited and/or prevented.

Although the example method of manufacturing the IC device 100 has been described with reference to FIGS. 11A to 11J and 12A to 12K, it will be understood that the IC device 100A shown in FIG. 5, the IC device 200 shown in FIGS. 6A and 6B, the IC device 400 shown in FIGS. 7A and 7B, the IC device 400A shown in FIGS. 8A and 8B, the IC device 500 shown in FIGS. 9, 10A, and 10B, and IC devices having variously changed structures may be manufactured by applying various modifications and changes to the processes described with reference to FIGS. 11A to 11J and 12A to 12K within the scope of inventive concepts.

For example, to manufacture the IC device 200 shown in FIGS. 6A and 6B, processes similar to the processes described with reference to FIGS. 12A to 12K may be performed. However, in the process described with reference to FIG. 12I, a portion of the preliminary second dielectric film 166BL and a portion of the polishing stop film M1 may be polished from an upper portion of the resultant structure of FIG. 12H, and thus, a plurality of second dielectric films 266B may be formed from the preliminary second dielectric film 166BL. Subsequently, the IC device 200 shown in FIGS. 6A and 6B may be manufactured by performing the processes described with reference to FIGS. 12J and 12K.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While inventive concepts has been particularly shown and described with reference to embodiments thereof, it will be understood that various changes in form and details may be made therein without departing from the spirit and scope of the following claims.

What is claimed is:

1. An integrated circuit device comprising:

a conductive area on a substrate;

a first electrode connected to the conductive area on the substrate, a width of the first electrode in a lateral direction gradually increasing toward the substrate;

a second electrode on the substrate, the second electrode including a silicon germanium (SiGe) film, the SiGe film surrounding the first electrode; and a dielectric film between the first electrode and the second electrode, wherein a content of a component of the SiGe film varies according to a distance from the substrate.

2. The integrated circuit device of claim 1, wherein the SiGe film has a germanium (Ge) content that gradually reduces toward the substrate.

3. The integrated circuit device of claim 1, wherein the SiGe film further comprises at least one dopant, the at least one of dopant includes at least one of a fluorine (F) atom and a hydrogen (H) atom, and a content of the at least one dopant in the SiGe film gradually increases toward the substrate.

4. The integrated circuit device of claim 1, further comprising:

a bottom insulating pattern extending in a lateral direction on the conductive area, wherein the first electrode passes through an opening in the bottom insulating pattern, and a portion of the dielectric film is between the first electrode and the bottom insulating pattern.

5. The integrated circuit device of claim 1, wherein the dielectric film comprises a first dielectric film and a second dielectric film, the first dielectric film covers a sidewall of the first electrode between the first electrode and the second electrode, and the second dielectric film covers an uppermost surface of each of the first electrode and the first dielectric film.

6. The integrated circuit device of claim 1, wherein the second electrode further comprises a conductive metal-containing pattern between the dielectric film and the SiGe film.

7. The integrated circuit device of claim 1, wherein the second electrode further comprises an outer SiGe film, the outer SiGe film covers an uppermost surface of the dielectric film and an uppermost surface of the SiGe film, and a Ge content of the outer SiGe film is constant regardless of a distance from the substrate.

8. The integrated circuit device of claim 1, wherein the dielectric film comprises a first dielectric film and a second dielectric film, the first dielectric film covers a sidewall of the first electrode between the first electrode and the second electrode, and the second dielectric film covers an uppermost surface of the first electrode and an uppermost surface of the first dielectric film.

9. The integrated circuit device of claim 1, wherein the dielectric film is continuously in contact with a sidewall of the first electrode without being cut off from a vertical level of a lowermost surface of the first electrode to a vertical level of an uppermost surface of the first electrode.

10. An integrated circuit device comprising:

a substrate having a memory cell area and an interfacial area adjacent to the memory cell area, the substrate including a plurality of active areas in the memory cell area;

a plurality of conductive areas at a first vertical level on the substrate in the memory cell area, each conductive area among the plurality of conductive areas being connected to one active area from the plurality of active areas; and a plurality of capacitors at a second vertical level on the substrate in the memory cell area, the plurality of capacitors being respectively connected to the plurality of conductive areas, the second vertical level being higher than the first vertical level, wherein the plurality of capacitors includes a plurality of first electrodes, a second electrode having a plurality of holes inside which the plurality of first electrodes are contained, and a plurality of dielectric films apart from each other and respectively one-by-one inside the plurality of holes each of the plurality of first electrodes have a bottom surface in contact with a corresponding conductive area among the plurality of conductive areas, each of the plurality of first electrodes has a width that gradually increases toward the substrate in a lateral direction, the second electrode includes a silicon germanium (SiGe) film, a content of a component of the SiGe film varies according to a distance from the substrate, and each of the plurality of dielectric films surrounds a corresponding one of the plurality of first electrodes.

11. The integrated circuit device of claim 10, wherein the SiGe film has a germanium (Ge) content that gradually reduces toward the substrate.

12. The integrated circuit device of claim 10, wherein the SiGe film further comprises at least one dopant, the at least one of dopant includes at least one of a fluorine (F) atom and a hydrogen (H) atom, and a content of the at least one dopant in the SiGe film gradually increases toward the substrate.

13. The integrated circuit device of claim 10, wherein the second electrode further comprises an outer SiGe film, the outer SiGe film covers uppermost surfaces of the plurality of dielectric films and an uppermost surface of the SiGe film, the SiGe film has a Ge content that gradually reduces toward the substrate, and a Ge content of the outer SiGe film is constant Ge content regardless of a distance from the substrate.

14. The integrated circuit device of claim 10, further comprising:

a bottom insulating pattern extending on the plurality of conductive areas in the lateral direction, wherein the plurality of first electrodes pass through a plurality of openings in the bottom insulating pattern, a lowermost surface of the SiGe film contacts a top surface of the bottom insulating pattern, and the SiGe film continuously extends without being cut off in a vertical direction from the lowermost surface of the SiGe film to an uppermost surface of the SiGe film between two first electrodes that are adjacent to each other from among the plurality of first electrodes.

15. The integrated circuit device of claim 10, further comprising:

a bottom insulating pattern extending on the plurality of conductive areas in the lateral direction, wherein the plurality of first electrodes pass through a plurality of openings in the bottom insulating pattern, and each of the plurality of dielectric films comprises a portion between the bottom insulating pattern and a corresponding first electrode among the plurality of first electrodes.

16. The integrated circuit device of claim 10, wherein each of the plurality of dielectric films comprises a first dielectric film in contact with a sidewall of a corresponding first electrode among the plurality of first electrodes, and a second dielectric film in contact with an uppermost surface of the corresponding first electrode among the plurality of first electrodes, and the second dielectric film is farther away from the substrate than the SiGe film.

17. The integrated circuit device of claim 10, wherein the second electrode further comprises a plurality of conductive metal-containing patterns inside the plurality of holes of the second electrode, and each of the plurality of conductive metal-containing patterns is between the SiGe film and a corresponding dielectric film among the plurality of dielectric films.

18. The integrated circuit device of claim 10, wherein the second electrode further comprises an outer SiGe film, the outer SiGe film covers a top surface of each of the plurality of first electrodes, the plurality of dielectric films, and the SiGe film in the memory cell area, the outer SiGe film covers a sidewall of the SiGe film in the interfacial area, the outer SiGe film has an outermost surface that constitutes outermost portions of the plurality of capacitors in the lateral direction, and the outermost surface planarly extends in a vertical direction without a step in a vertical level region in which the plurality of first electrodes and the SiGe film are arranged.

19. The integrated circuit device of claim 10, wherein a sidewall of each of the plurality of holes in the SiGe film continuously extends without being cut off or bent from a vertical level of a lowermost surface of each of the plurality of first electrodes to a vertical level of an uppermost surface of each of the plurality of first electrodes.

20. An integrated circuit device comprising:

a substrate having an active area;

a bit line on the substrate;

an insulating structure covering a top surface of the bit line and a sidewall of the bit line;

a contact structure on the substrate, the contact structure including a contact plug in contact with the active area of the substrate, a metal silicide film covering a top surface of the contact plug, and a conductive landing pad covering a top surface of the metal silicide film, the contact plug being adjacent to the bit line in a lateral direction and apart from the bit line with the insulating structure therebetween, the metal silicide film being apart from the bit line with the insulating structure therebetween, the conductive landing pad being apart from the bit line with the insulating structure therebetween;

a first electrode on the conductive landing pad, the first electrode having a bottom surface in contact with a top surface of the conductive landing pad, a width of the first electrode in the lateral direction gradually increasing toward the substrate;

a second electrode on the substrate and having a hole that contains the first electrode, the second electrode including a doped silicon germanium (SiGe) film, a content of at least one component of the doped SiGe film varying according to a distance from the substrate; and a dielectric film inside a hole of the doped SiGe film, the dielectric film between the first electrode and the second electrode, wherein in the doped SiGe film, the at least one component includes at least one of a germanium (Ge) atom, a fluorine (F) atom, and a hydrogen (H) atom.

* * * * *